United States Patent [19]
Williams et al.

[11] Patent Number: 5,661,322
[45] Date of Patent: Aug. 26, 1997

[54] BIDIRECTIONAL BLOCKING ACCUMULATION-MODE TRENCH POWER MOSFET

[75] Inventors: Richard K. Williams, Cupertino; Shekar S. Mallikarjunaswamy, Santa Clara, both of Calif.

[73] Assignee: Siliconix incorporated, Santa Clara, Calif.

[21] Appl. No.: 459,559

[22] Filed: Jun. 2, 1995

[51] Int. Cl.⁶ .......................... H01L 29/76; H01L 29/94
[52] U.S. Cl. .................... 257/331; 257/327; 257/329; 257/330
[58] Field of Search .................... 257/327, 329, 257/330, 331

[56] References Cited

U.S. PATENT DOCUMENTS

| | | | |
|---|---|---|---|
| 4,663,644 | 5/1987 | Shimizu | 257/331 |
| 4,903,189 | 2/1990 | Ngo et al. | 363/127 |
| 5,430,315 | 7/1995 | Rumennik | 257/331 |

OTHER PUBLICATIONS

B.J. Baliga et al., "The Accumulation–Mode Field–Effect Transistor: A New Ultralow On-Resistance MOSFET", IEEE Electron Device Letters, vol. 13, No. 8, Aug. 1992, pp. 427–429.

T. Syau, "Comparison of Ultralow Specific On–Resistance UMOSFET Structures: The ACCUFET, EXTFET, INVFET, and Conventional UMOSFET's", IEEE Transactions on Electon Devices, vol. 41, No. 5, May 1994, pp. 800–808.

*Primary Examiner*—Mahshid D. Saadat
*Assistant Examiner*—Valencia Martin Wallace
*Attorney, Agent, or Firm*—Skjerven, Morrill, MacPherson, Franklin & Friel; David E. Steuber

[57] ABSTRACT

One or more diodes are integrated with a trenched gate accumulation-mode MOSFET to provide protection for the gate oxide layer. In a preferred embodiment, a first pair of diodes are formed in a series connection between the source and the gate of the MOSFET. A third diode may be added to provide a series diode pair between the drain and the gate of the MOSFET. A pair of accumulation-mode MOSFETs may be formed in a single chip to provide a push-pull halfbridge circuit, and a multiple-phase motor driver may be fabricated in two chips, with the high side MOSFETs being formed in one chip and the low side MOSFETs being formed in the other chip. The accumulation-mode MOSFET may be used as an AC switch by connecting its gate to a gate bias circuit which finds the lower of the source and drain voltages of the accumulation-mode MOSFET.

36 Claims, 22 Drawing Sheets

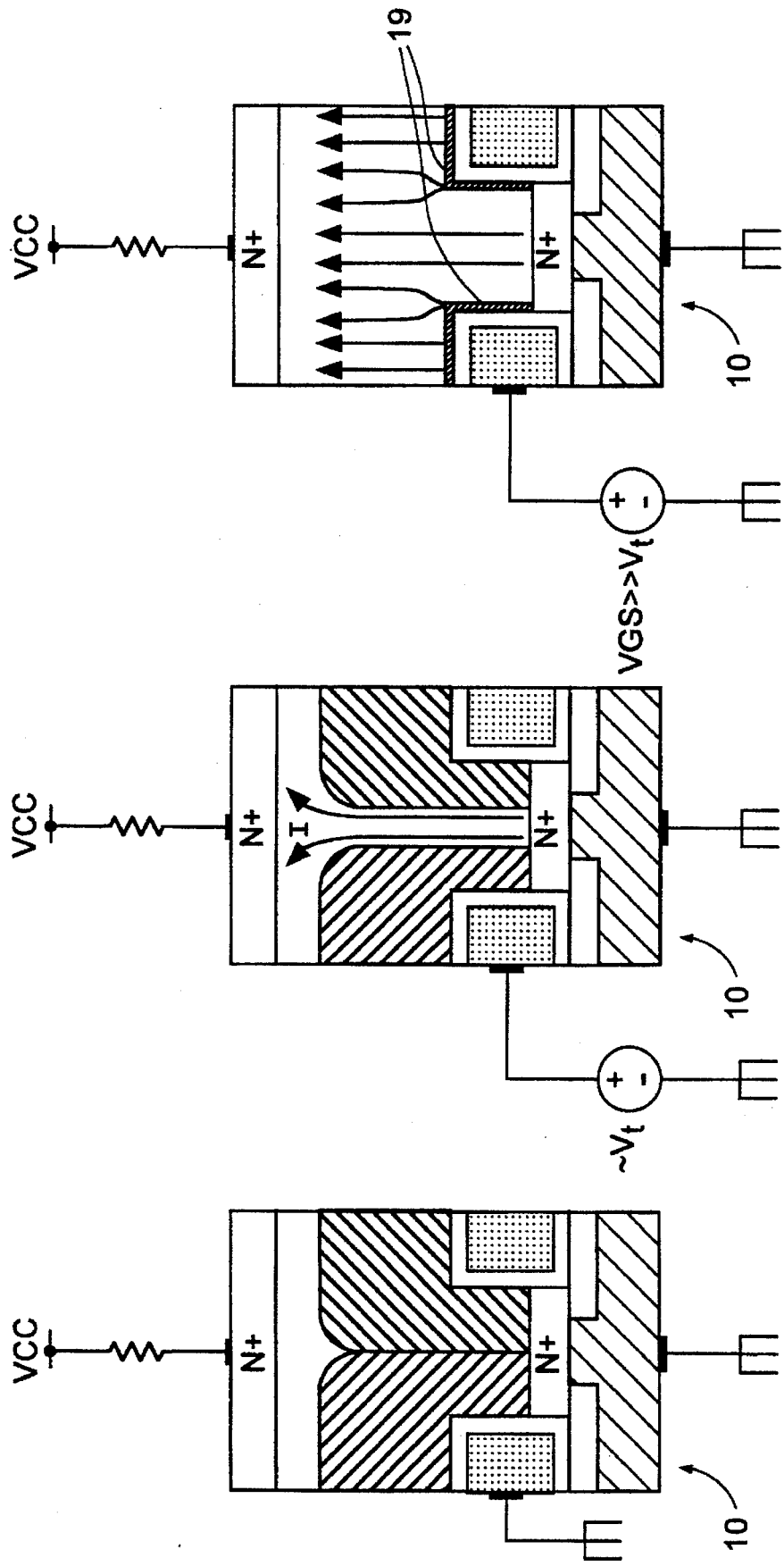

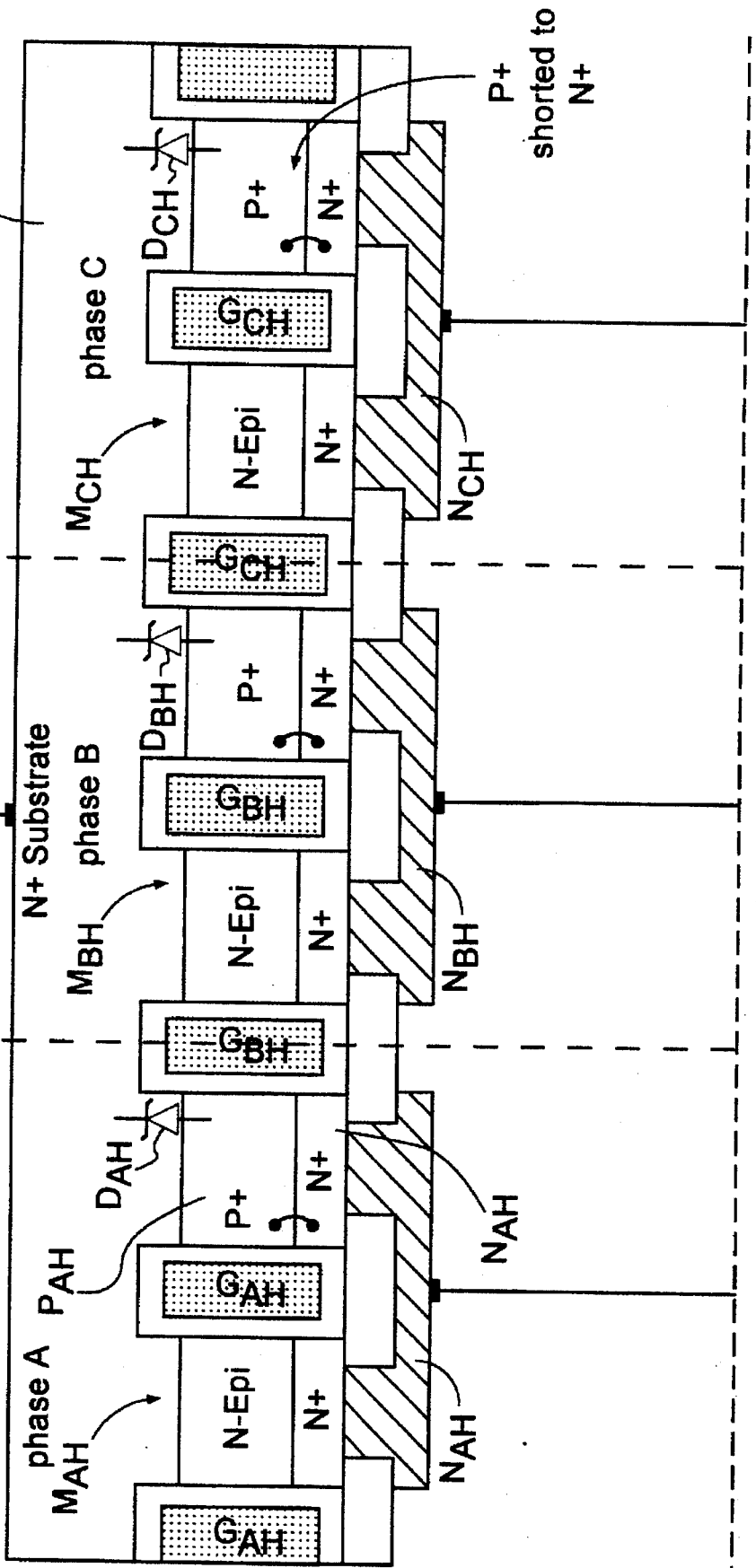

BIDIRECTIONAL BLOCKING ACCUMULATION-MODE TRENCH POWER MOSFET

CROSS REFERENCE TO RELATED APPLICATIONS

This application is related to application No. 08/459,054, filed concurrently herewith, and application No. 08/367,515, filed Dec. 30, 1994, each of which is incorporated herein by reference in its entirety.

FIELD OF THE INVENTION

This invention relates to power accumulation-mode field-effect transistors and, in particular, to a power accumulation-mode field-effect transistor which is capable of blocking current in either direction.

BACKGROUND OF THE INVENTION

An accumulation-mode field-effect transistor, sometimes referred to herein as an "ACCUFET", is a trench-type MOSFET which requires no body region and hence no PN junctions. The region between the trenched gates, sometimes called a "mesa", is made relatively narrow, and the gate material (typically polysilicon) is normally doped in such a way that it has a work function which depletes the entire mesa region. The current path extends vertically through the mesa to the substrate. The trenches are sometimes formed entirely in an epitaxial layer which is grown on the substrate.

A cross-sectional view of a typical ACCUFET 10 is illustrated in FIG. 1, with the ACCUFET being connected as a low-side switch between a load L and ground. A trenched gate 11 is etched in a silicon material 12, which includes an N-epitaxial layer 13 grown on an N+ substrate 14. Trenched gate 11 defines a cell 10A. An N+ region 15 is formed at the surface of the inverted mesa between gate 11. In a typical ACCUFET, gate 11 would be formed of polysilicon doped with P-type dopant to a concentration of $1 \times 10^{18}$ to $5 \times 10^{19}$ cm$^{-3}$, and the N-epitaxial layer 13 would be doped to a concentration of $1 \times 10^{14}$ to $1 \times 10^{15}$ cm$^{-3}$. For purposes of identification, unless otherwise indicated the N+ region 15 will be referred to herein as the "source" and the N+ substrate 14 will be referred to as the "drain", regardless of the polarity of the voltage applied to ACCUFET 10.

The cells of an ACCUFET may be in the form of longitudinal stripes, as shown in FIG. 15A, or they may be in the form of a closed figure such as a hexagon, square, polygon or other shape, as shown in FIG. 15B.

ACCUFET 10 is turned off when the gate voltage is equal to the source voltage (i.e., $V_{gs}=0$). If $V_{gs}$ is increased, the depletion regions surrounding the gates (shown by the dashed lines) contract and open a current path between the source and the drain. With further increasing $V_{gs}$ the depletion regions continue to contract until eventually accumulation regions are formed adjacent the trenches, enhancing channel conduction and further lowering the on-resistance of the device.

This sequence of events is illustrated in FIGS. 2A, 2B and 2C, FIG. 2A showing ACCUFET 10 in the off condition; FIG. 2B showing ACCUFET 10 turned partially on, with $V_{gs}$ reaching a voltage somewhat analogous to the threshold voltage $V_t$ of an ordinary MOSFET; and FIG. 2C showing ACCUFET 10 turned fully on, with the accumulation regions being designated by the numerals 19. In FIGS. 2B and 2C the arrows represent the flow of electrons from the source to the drain.

Additional information concerning ACCUFETs is given in U.S. Pat. No. 4,903,189 to Ngo et al.; B. J. Baliga et al., "The Accumulation-Mode Field-Effect Transistor: A New Ultralow On-Resistance MOSFET", IEEE Electron Device Letters, Vol. 13, No. 8, August 1992, pp. 427–429; and T. Syau et al., "Comparison of Ultralow Specific On-Resistance UMOSFET Structures: The ACCUFET, EXTFET, INVFET, and Conventional UMOSFET's", IEEE Electron Device Letters, Vol. 41, No. 5, May 1994, pp. 800–808, each of which is incorporated herein by reference in its entirety.

ACCUFETs can be fabricated with a very high cell density and a very low on-resistance. Nonetheless, despite these advantages, for several reasons ACCUFETs have not so far achieved widespread use in the field of power semiconductor devices. Two of the principal reasons are their inability to withstand high voltages when they are in an off condition and their inability to block voltages bidirectionally, which in turn has prevented them from being used as AC switches.

These problems are illustrated in FIGS. 3, 4A, 4B, 5A, and 5B. FIG. 3 shows ACCUFET 10 connected as a high-side battery disconnect switch between a battery B and load L. A battery charger A is also connected on the load side of ACCUFET 10. Gate 11 is grounded when ACCUFET is turned off. In this condition, gate oxide layer 11A in the vicinity of the N+ source region 15 must be able to withstand the entire battery voltage.

FIG. 4A shows battery B as a two-cell lithium ion battery whose peak voltage is 4.2V per cell or a total of 8.4V. ACCUFET 10 is turned off, with gate 11 being grounded. The source of ACCUFET 10 is tied to 8.4V and the drain of ACCUFET 10 is at 0V because load L is represented as a discharged capacitor in this case. FIG. 4B is a detailed view of the source and gate of ACCUFET 10 showing the equipotential lines squeezed together in the gate oxide 11A. Gate oxide 11A must absorb essentially the entire voltage drop between the battery ($V_{batt}$) and the grounded gate.

FIG. 5A shows the situation with battery B completely discharged and battery charger operating to provide a voltage ($V_{charger}$) of 12V. Again, ACCUFET 10 is turned off by grounding gate 11. Here the main voltage drop occurs between the gate and the drain, and FIG. 5B shows the equipotential lines in this region of the ACCUFET. While the total voltage drop is higher than in the situation of FIGS. 4A and 4B, in this embodiment a portion of the N-epitaxial layer lies between the bottom of the gate trench and the N+ substrate and thus part of the voltage drop is absorbed by the depleted N-epitaxial region. Therefore, the stress on the gate oxide may actually be lower than in the case shown in FIG. 4A. Nonetheless, in either of the cases illustrated in FIGS. 4A and 5A, there is a significant risk that the gate oxide will be exposed to excessive voltages and will be damaged or ruptured as a result. This is particularly true in the commonplace situation where the load has inductive components that generate voltage spikes as it is switched. The inability of ACCUFETs to withstand these voltage spikes has seriously limited their use in the power MOSFET field.

SUMMARY OF THE INVENTION

The ACCUFET of this invention includes a plurality of cells bordered by trench gates and containing semiconductor material of a first conductivity type. The trench gates may be formed, for example, in a lightly doped epitaxial layer. Each of the trench gates includes a conductive gate material, typically polysilicon, and an insulating layer, typically silicon dioxide, which insulates the conductive gate material from the semiconductor material in each cell.

In order to limit the electric field imposed on the gate oxide layer, one or more regions of a second conductivity type are created, thereby creating one or more PN junctions which act as diodes. The doping levels and locations of the PN junctions are set so as to establish breakdown voltages for the diodes which prevent the voltage across the gate oxide from reaching a level which would cause the gate oxide to rupture or be damaged.

In one embodiment, the region of second conductivity type adjoins two separate regions of the first conductivity type. One of the regions of first conductivity type is connected to the source of the ACCUFET, and the other region of first conductivity type is connected to the gate of the ACCUFET. As a result, a first pair of back-to-back diodes is created between the source and the gate, and a second pair of back-to-back diodes is created between the drain and the gate. The respective diode pairs will therefore break down when the voltage between the source and gate, or between the drain and gate, exceeds a voltage which is the summation of the forward voltage drop of one of the diodes and the breakdown voltage of the other diode.

The regions of first and second conductivity type are formed wherever necessary to provide a protective diode for the ACCUFET.

According to another aspect of the invention, a gate drive circuit is connected to the source and drain of the ACCUFET. The gate drive circuit detects the lower of source and drain voltages and provides a gate bias that is related to the lower of these two voltages. This enables the ACCUFET to be used as an AC switch.

BRIEF DESCRIPTION OF THE DRAWING

FIGS. 2A–2C are cross-sectional views which illustrate the changes in the depletion region which controls the current flow through an accumulation-mode MOSFET.

DESCRIPTION OF THE INVENTION

Figure 1:
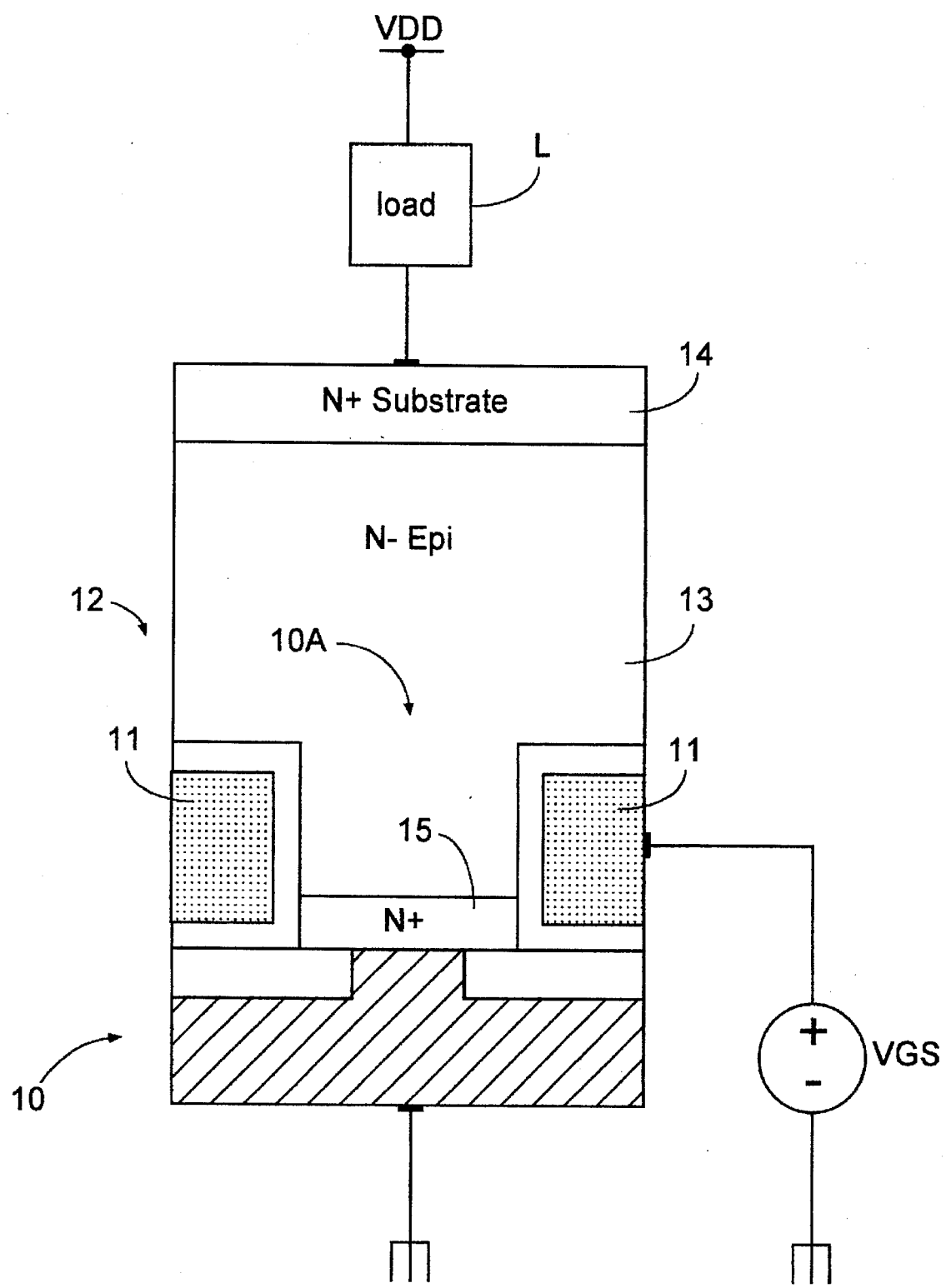
FIG. 1 illustrates a cross-sectional view of a conventional accumulation-mode MOSFET connected as a low-side switch.
Figure 3:
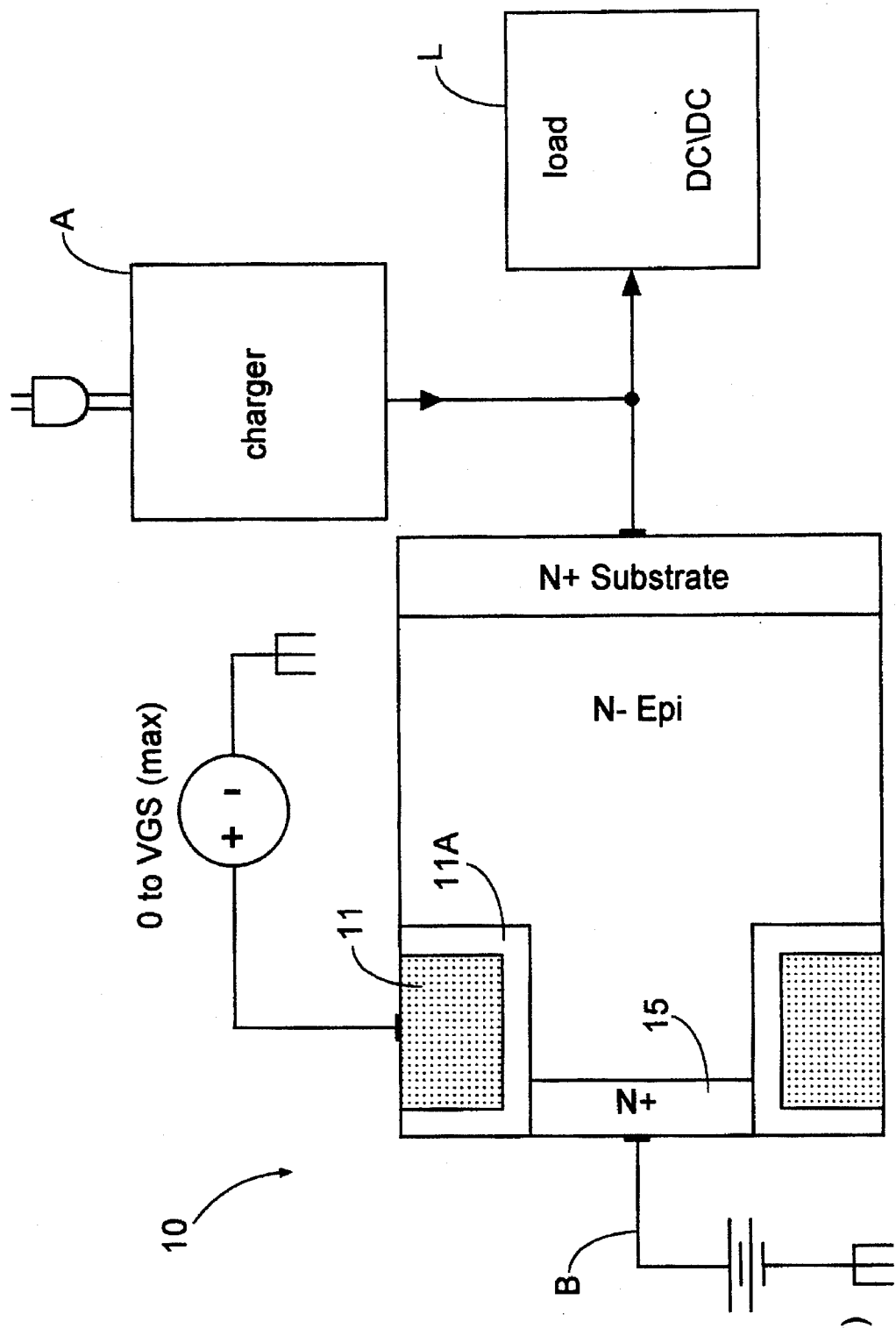
FIG. 3 illustrates a cross-sectional view of a conventional accumulation-mode MOSFET connected as a high-side battery disconnect switch.
Figure 5A:
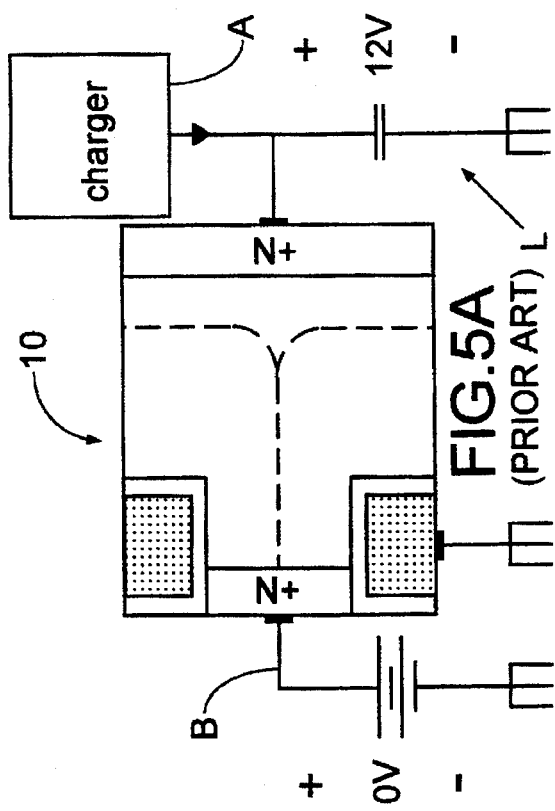
FIG. 5A illustrates a cross-sectional view of a conventional accumulation-mode MOSFET having its drain biased positive relative to its source.
Figure 5B:
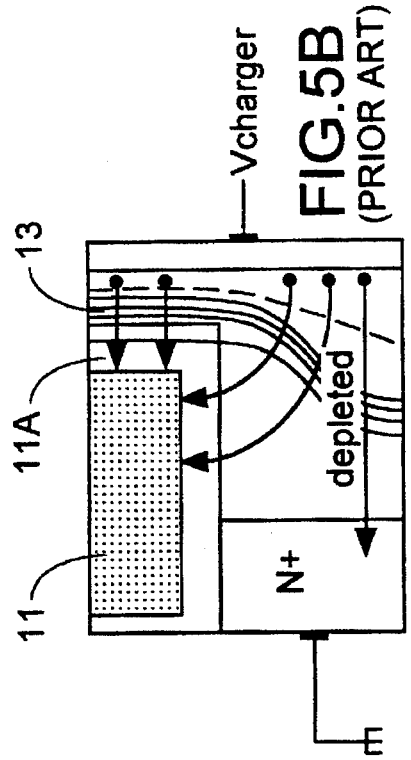
FIG. 5B illustrates the electric field lines in the epitaxial layer and gate oxide of the MOSFET shown in FIG. 5A.
Figure 4A:
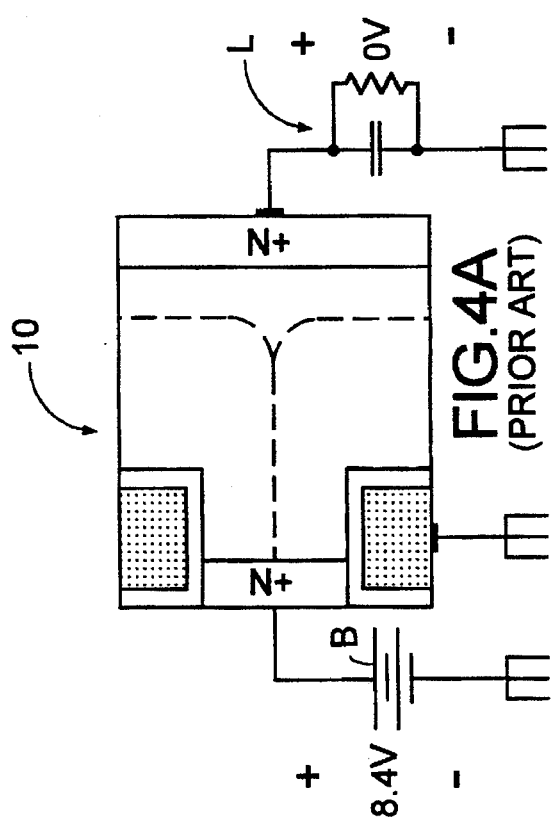
FIG. 4A illustrates a cross-sectional view of a conventional accumulation-mode MOSFET having its source biased positive relative to its drain.
Figure 4B:
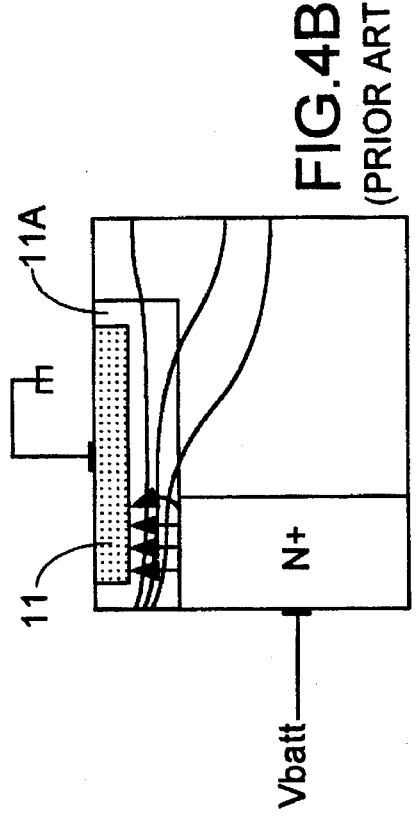
FIG. 4B illustrates the electric field lines in the gate oxide of the MOSFET shown in FIG. 4A.
Figure 6A:
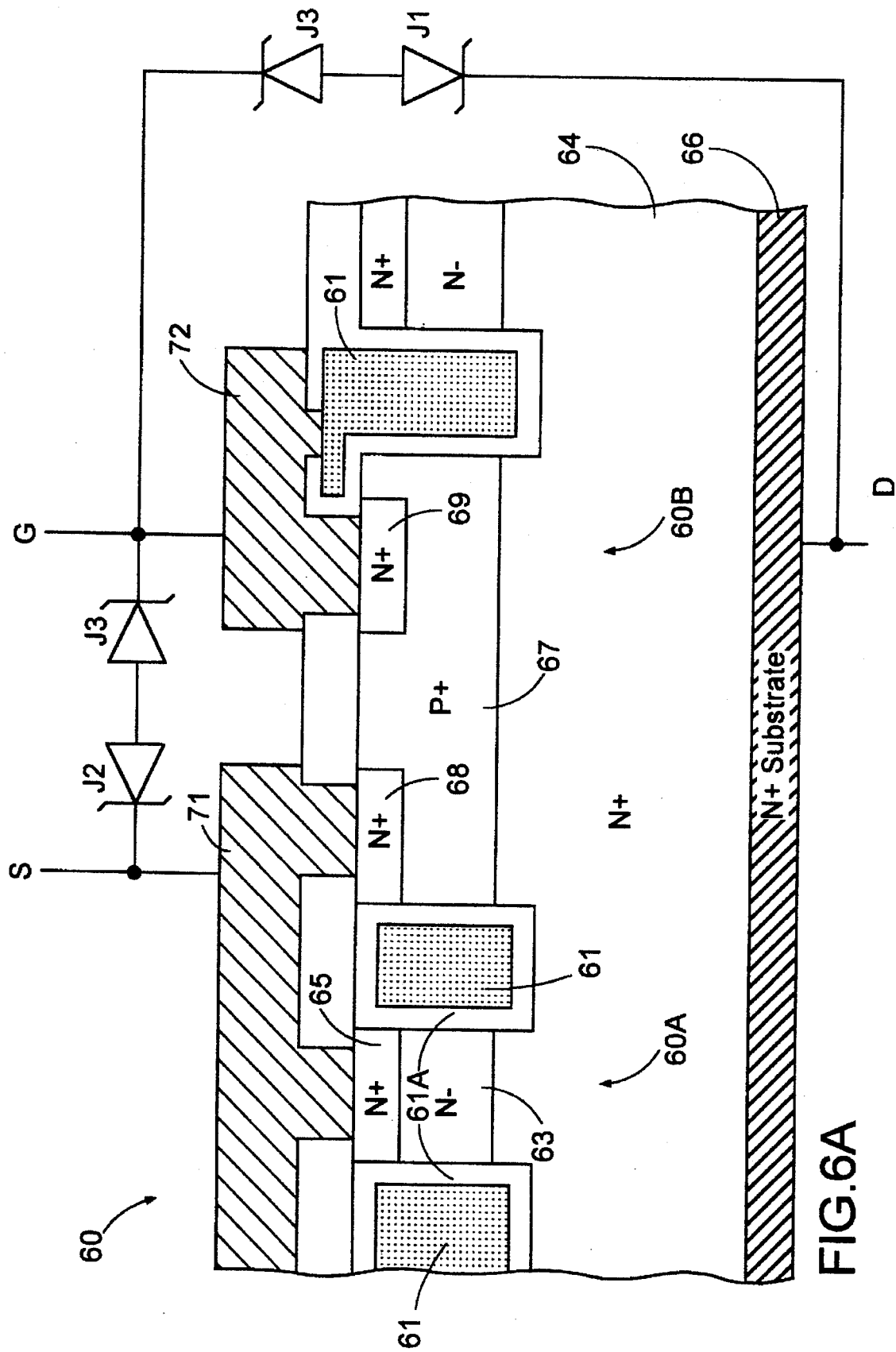
FIG. 6A illustrates a cross-sectional view of an accumulation-mode MOSFET in accordance with a preferred embodiment of the invention.

A preferred embodiment of the this invention is shown in various forms in FIGS. 6A–6E. FIG. 6A shows a cross-sectional view of ACCUFET 60 which includes a cell 60A (note that ACCUFET 60 and cell 60A are inverted as compared with ACCUFET 10 and cell 10A shown in FIG. 1). ACCUFET 60 is similar to ACCUFET 10 with the difference the gate 61 extends into N+ substrate 64 rather than being confined to the N− epitaxial layer 63. ACCUFET 10 can also be fabricated with the trench extending only into the epitaxial layer in the manner shown in FIG. 1. The width of cell 60A measured between the two sections of gate 61 would typically be in the range of 0.5 to 2.0 μm, and the N− epitaxial layer 63 would be doped to $1 \times 10^{14}$ to $1 \times 10^{15}$ cm$^{-3}$ to assure that cell 60A is turned off when the gate-to-source voltage is zero. Gate 61 is typically polysilicon that is heavily doped with P-type dopant for an N-channel device or with N-type dopant for a P-channel device. A metal layer 66 contacts the N+ substrate 64, which acts as the drain. It will be understood that a submerged N+ layer instead of the N+ substrate could be used as the drain and that the drain could be contacted from the top side of the ACCUFET by means of, for example, an N+ sinker region and top side contact.

A protective cell 60B is formed adjacent to cell 60A. Protective cell 60B includes a P+ region 67 and N+ regions 68 and 69, which are formed within P+ region 67. P+ region 67 should be doped to a sufficient level (e.g., $10^{17}$ or $10^{18}$ cm$^{-3}$ or higher) to minimize parasitic bipolar conduction in the two NPN transistors formed by the juncture of N+ regions 68 and 69, N+ substrate 64, and P+ region 67. A metal layer 71 connects N+ region 68 to N+ source 65, and a metal layer 72 connects N+ region 69 to gate 61. In this embodiment cell 60B is substantially wider than cell 60A to minimize lateral parasitic NPN bipolar conduction, although this is not required in all embodiments.

Figure 6C:
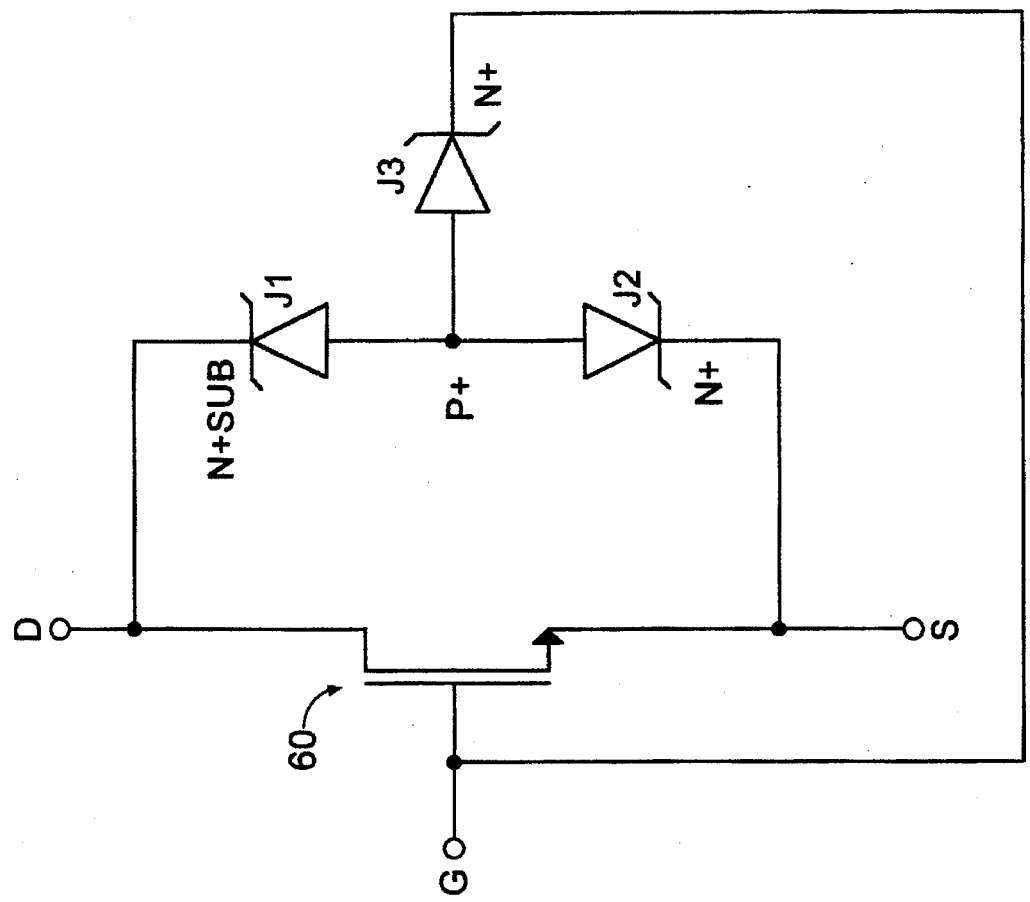
FIGS. 6C and 6D illustrate equivalant circuit diagrams of the MOSFET shown in FIG. 6A.
Figure 6B:
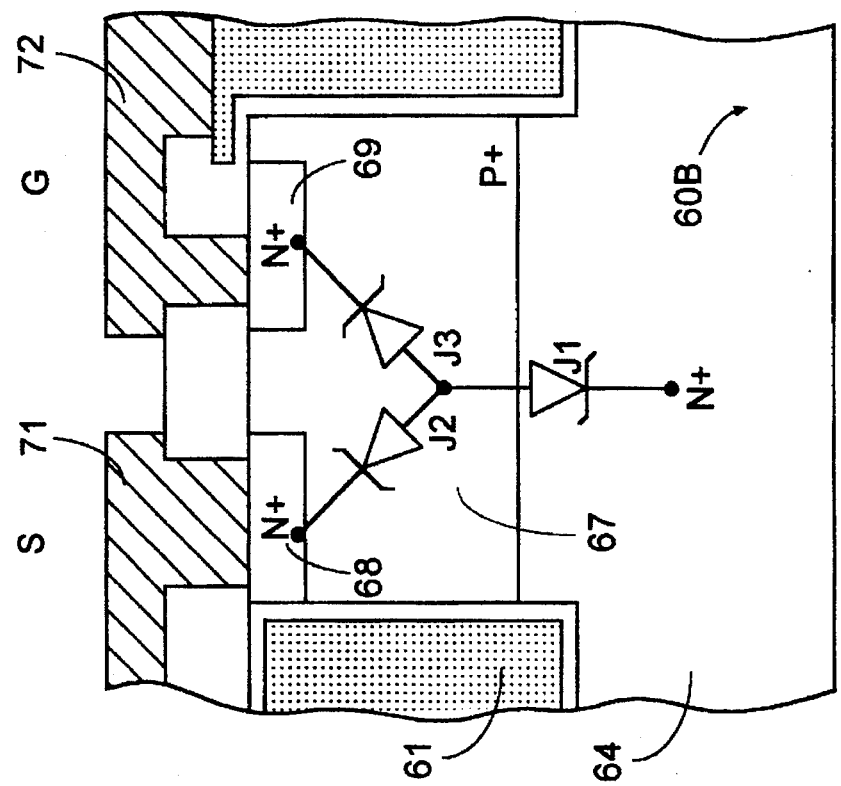
FIG. 6B illustrates the location of the diodes within the MOSFET shown in FIG. 6A.
Figure 6D:
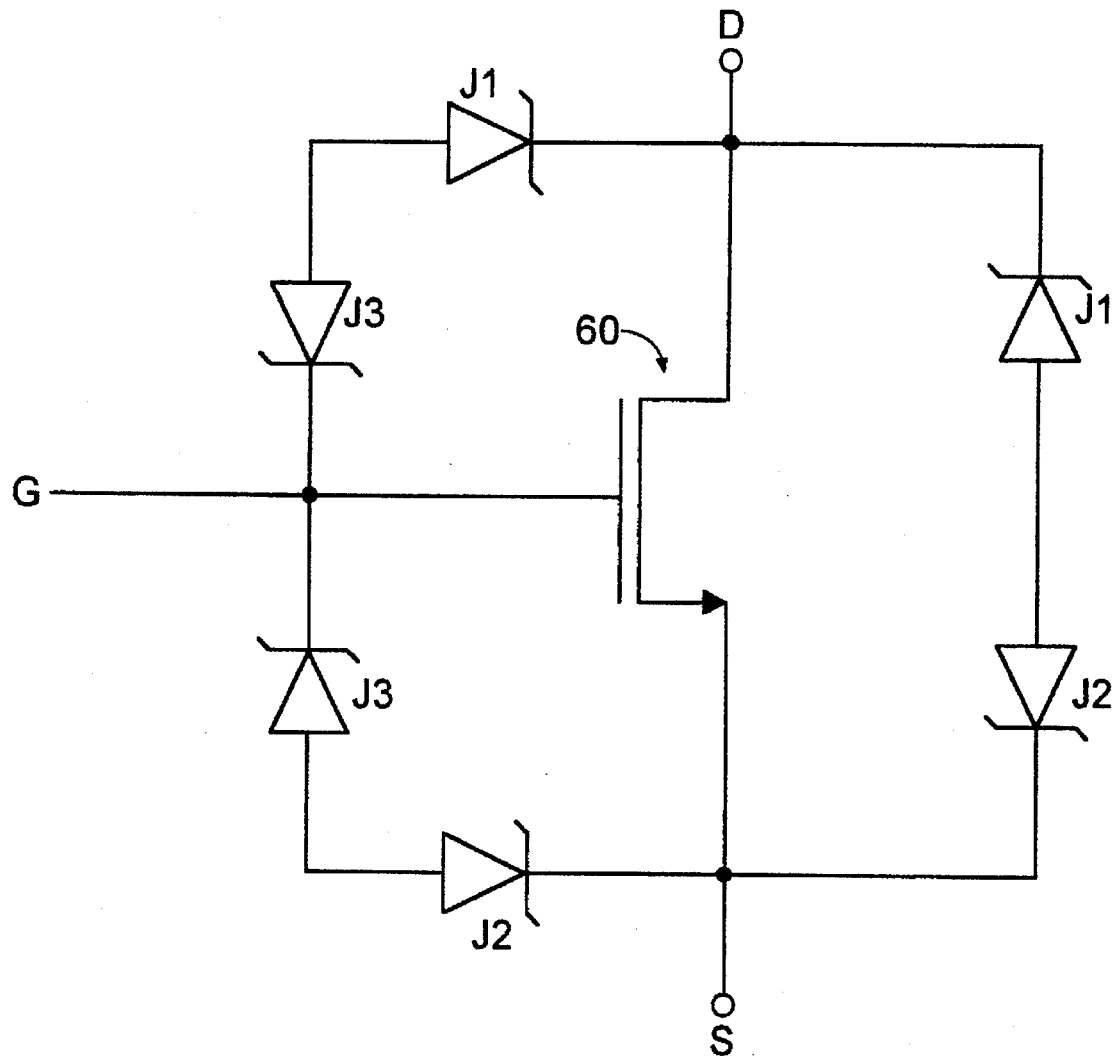

FIG. 6B is a detailed view of cell 60B showing schematically the three diodes J1, J2 and J3 that are formed between the drain, source and gate of the ACCUFET. Diode J1 is formed at the junction of N+ substrate 64 and P+ region 67; diode J2 is formed at the junction of P+ region 67 and N+ region 68; and diode J3 is formed at the junction of P+ region 67 and N+ region 69. As shown in FIG. 6A, diodes J2 and J3 form a back-to-back pair between the source and the gate of ACCUFET 60, and diodes J1 and J3 form a back-to-back pair between the drain and gate of ACCUFET 60. FIGS. 6C and 6D are schematic views of ACCUFET 60 showing the connection of diodes J1–J3 between the source, drain and gate of the ACCUFET.

Referring again to FIG. 6A, as the voltage at N+ source region 65 increases with respect to the voltage at gate 61, diode J2 is reverse-biased and diode J3 is forward-biased. When the source-to-gate voltage reaches a level equal to the sum of the breakdown voltage of diode j2 and the forward voltage drop across diode J3 (approximately 0.6 V), diode J2 will break down and the source voltage will be clamped to the gate voltage. Thus, the voltage across the gate oxide layer 61A in the vicinity of N+ source region 65 will be limited to this voltage difference. By properly designing the dopant concentrations of P+ region 67 and N+ region 68, damage to gate oxide layer 61A can be prevented. In accordance with the industry standard, the voltage across gate oxide layer 61A should not exceed 4 MV/cm·$X_{OX}$, where $X_{OX}$ is the thickness of gate oxide layer 61A expressed in centimeters. This value represents 50% of the voltage at which a silicon oxide layer will ultimately rupture or incur damage. For example, a 400 Å thick oxide layer will rupture at about 32V, and it should be clamped at a voltage not to exceed 16V.

If the source voltage should fall with respect to the gate voltage, diode J3 will ultimately break down and protect the gate oxide layer in a similar manner.

Similarly, as the voltage at N+ substrate 64 increases with respect to the voltage at gate 61, diode J1 is reverse-biased and diode J3 is forward-biased. When the drain-to-gate voltage reaches a level equal to the sum of the breakdown voltage of diode J1 and the forward voltage drop across diode J3, diode J1 will break down and the drain voltage will be clamped to the gate voltage. Thus, the voltage across the gate oxide layer 61A at the bottom of the gate trenches will be limited to this voltage difference. By properly designing the dopant concentrations of P+ region 67 and N+ region 69, damage to gate oxide layer 61A in this region can be prevented. If the drain voltage should fall with respect to the gate voltage, diode J3 will ultimately break down and protect the gate oxide layer in a similar manner.

As is evident in FIGS. 6B–6D, diodes J1 and J2 form a third back-to-back pair between the source and drain of ACCUFET 60 and enable ACCUFET 60 to be used to block current in either direction when the ACCUFET cell 60A is turned off. If diode J1 is made sufficiently large in area, it can also be used to absorb energy from inductive loads during turn-off. In the event that the gate bias voltage is limited by its drive circuitry to a potential that is between the potentials of the source and drain terminals, then the N+ region 69 and its contact can be eliminated, and diode J3 is replaced by an open circuit in the equivalent schematics of FIGS. 6C and 6D.

Figure 6E:
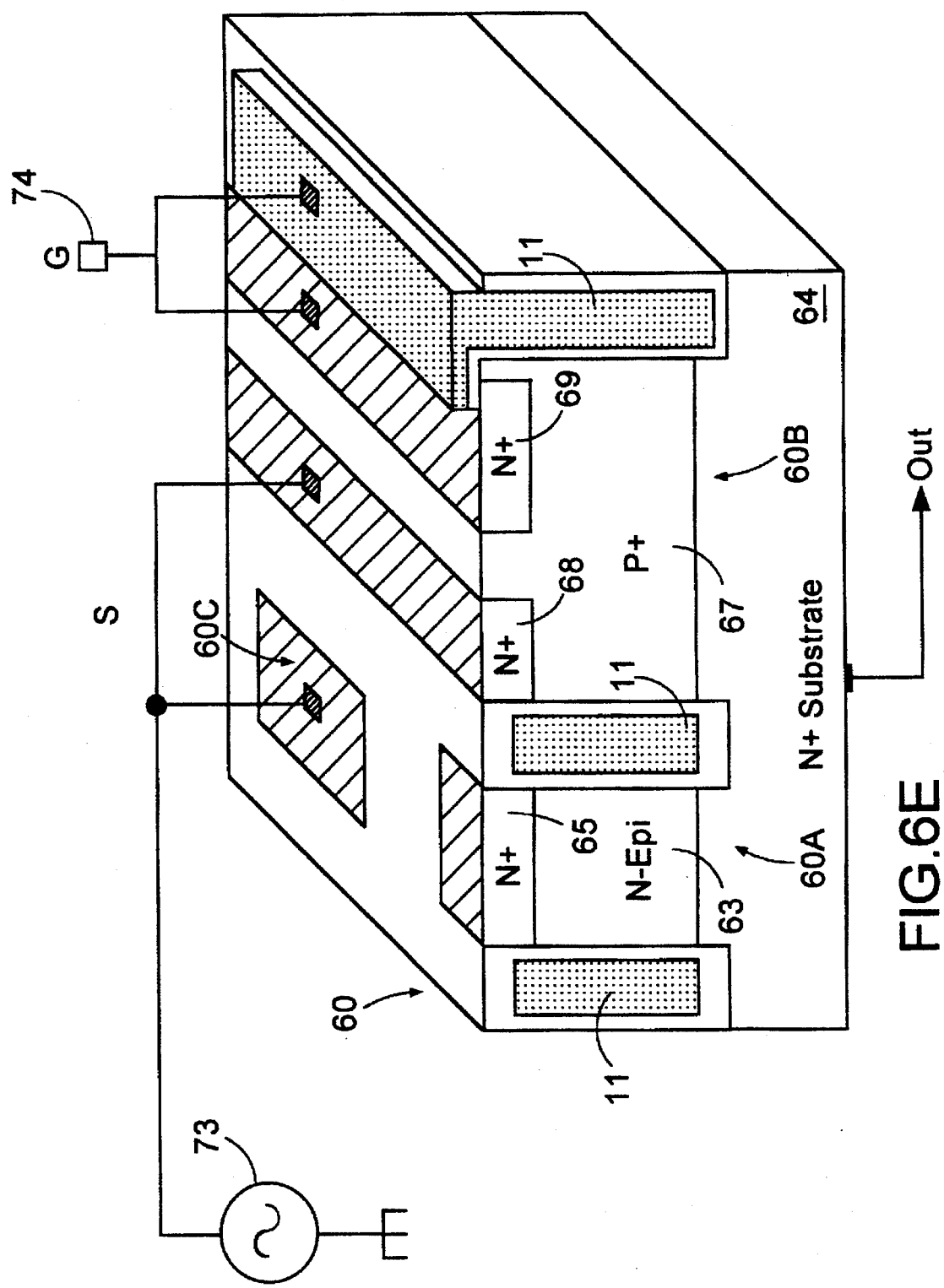
FIG. 6E illustrates a cross-sectional view of an accumulation-mode MOSFET used as an AC switch.

FIG. 6E is a three-dimensional cross-sectional view of ACCUFET 60 that is used as an AC switch connected to an AC voltage source 73. In FIG. 6E, the ACCUFET cells (cell 60A and the neighboring cell 60C) are closed rectangular while protective cell 60B is relatively long cell which appears as a stripe on the surface of ACCUFET 60. As described more fully below, a gate bias generator 74 is used to provide a gate bias which is properly related to the AC signal from voltage source 73. In short, gate bias generator 74 must find the lower of the source and drain voltages as the AC signal oscillates and must adjust the gate bias to a proper value relative to that voltage so that the ACCUFET remains either in an on or off state. Regardless of the relative voltages between the source, drain and gate, there is always a reverse-biased diode present to prevent significant current flow through the ACCUFET when it is in an off condition. The P+ region 67 actually floats, which means that the leakage current through the parasitic NPN transistors formed by N+ regions 68 and 69, N+ substrate 67 and P+ region 67 will be amplified, producing an $I_{CEO}$ condition. Thus P+ region 67 must be heavily-doped not only to provide diode breakdown voltages which protect the gate oxide layer, but also to prevent excessive leakage currents through the device.

If the actual application of the ACCUFET switch in relation to a load is known, one can fabricate protective diodes wherever they are needed without necessarily using the three-diode matrix shown in FIGS. 6A–6E.

Figure 7A:
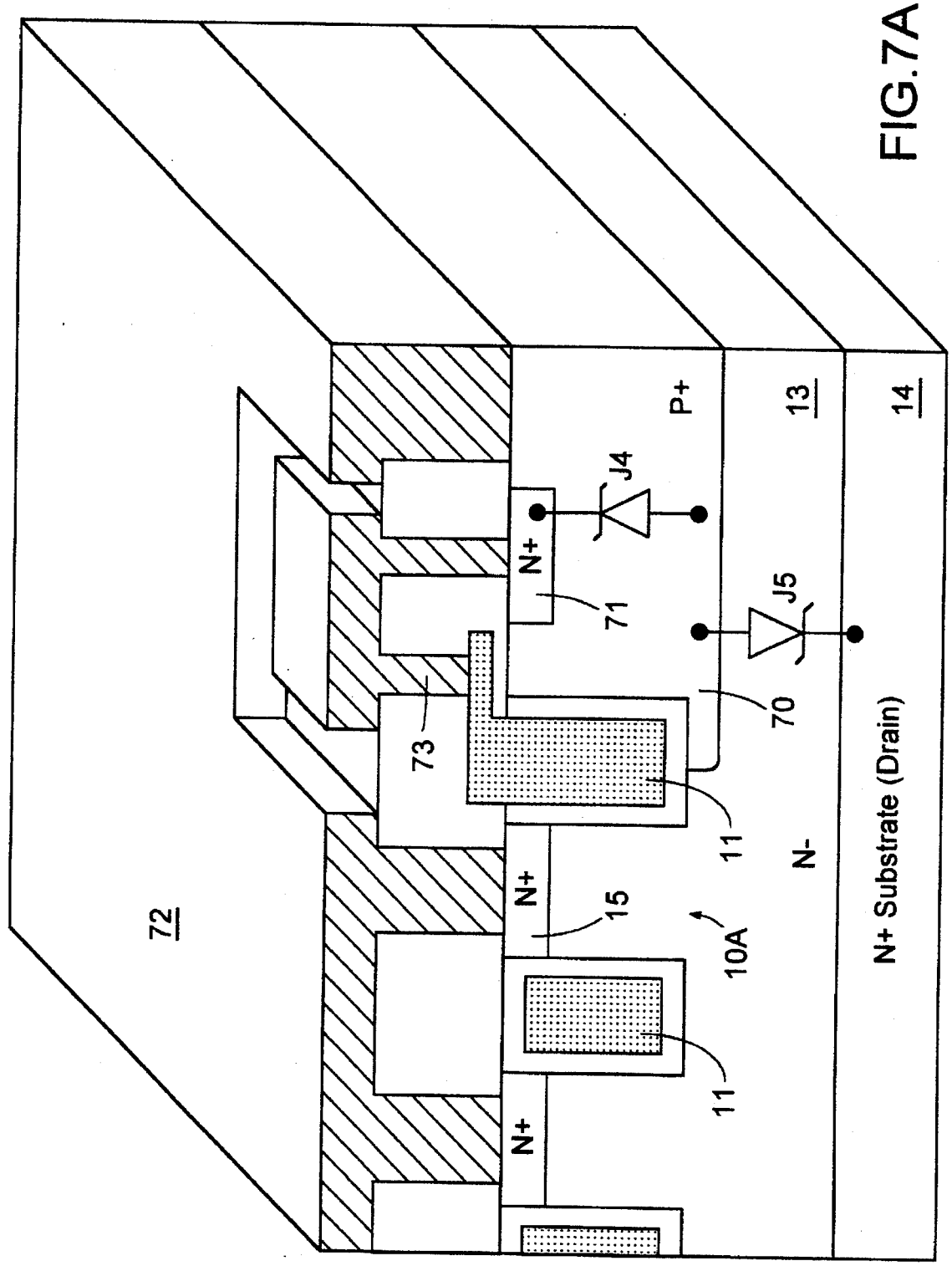
FIG. 7A illustrates a cross-sectional view of an accumulation-mode MOSFET in which an epitaxial layer separates the bottom of the gate trench from the substrate.
Figure 7B:
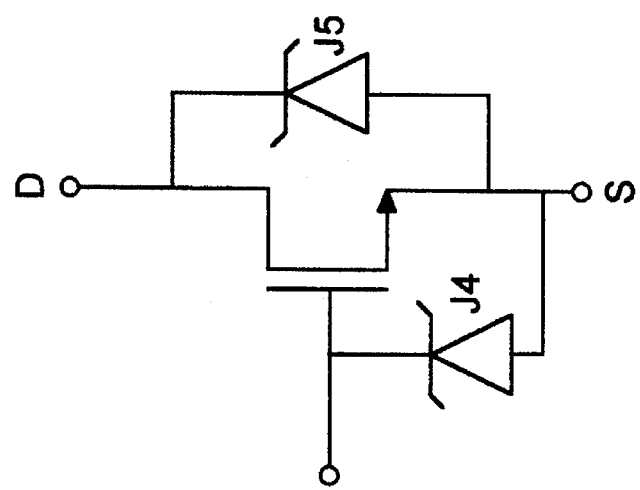
FIG. 7B illustrates an equivalent circuit diagram of the MOSFET shown in FIG. 7A.

For example, if one side of the ACCUFET will be exposed to a higher voltage difference with respect to the gate, the bottom of the gate trench can be held back from the heavily-doped substrate, as shown in FIG. 7A. The ACCUFET cell 10A in FIG. 7A is similar to cell 10A shown in FIG. 1 in that the gate trenches do not extend into the N+ substrate 14. A P+ region 70 is formed next to cell 10A and an N+ region 71 is formed within P+ region 70. A metal layer 72 ties P+ region 70 to N+ source region 15, and a metal layer 73 ties N+ region 71 to the gate 11. The junctions of P+ region 70 and N+ region 71 form diodes J4 and J5. As shown in the equivalent circuit diagram of FIG. 7B, the anode and cathode of diode J4 are connected to the source and gate, respectively, and the anode and cathode of diode J5 are connected to the source and drain, respectively, of the ACCUFET. Diode J4 functions to protect the gate oxide layer near the source in a manner similar to diode J3 in Fig. J3. However, there is no diode similar to diode J2 connected back-to-back in series with diode J4.

Diode J5 is a PIN diode which is formed by the combination of P+ region 70, N– epitaxial layer 13, and N+ substrate 14. The oxide layer at the bottom of the trench is protected by controlling the avalanche breakdown of diode J5, generally by adjusting the net spacing between P+ region 70 and N+ substrate 14. A graph showing the breakdown voltage of a PIN diode as a function of the doping concentration and width of the intermediate or "intrinsic" region (the "I" in "PIN") is provided in S. M. Sze, *Physics of Semiconductor Devices*, Second Edition, John Wiley & Sons (1981), p. 105, FIG. 32, which is incorporated herein by reference.

The maximum voltage across the gate oxide layer can be estimated using the following equation:

$$V_{total} = E_{OX} \cdot \left( \frac{\epsilon_{ox}}{\epsilon_{ox}} \cdot X_{epi} + X_{ox} \right)$$

where $V_{total}$ is the voltage drop between gate 11 and N+ substrate 14, $E_{OX}$ is the strength of the electric field in the gate oxide layer, $X_{epi}$ and $X_{ox}$ are the thicknesses of the N-epitaxial layer 13 between the bottom of the gate trench and the N+ substrate 14 and of the gate oxide layer, respectively, and $\epsilon_{ox}$ and $\epsilon_{si}$ are the permitivities of $SiO_2$ and silicon, respectively. However, this condition is normally not limiting because avalanche breakdown occurs in the N-epitaxial layer 13 (near a corner of the gate trench) before the gate oxide layer reaches the critical value of $E_{OX}$. Avalanche breakdown in N-epitaxial layer 13 can damage the gate oxide by causing hot carriers to be injected into the oxide. Accordingly, diode J5 should be designed to break down well below the voltage at which avalanche breakdown occurs in N-epitaxial layer 13, i.e.:

$$BV_{J5} << (X_{epi})(E_{si})$$

where $E_{si}$, the strength of the electric field in N-epitaxial layer 13, is typically between 20 and 30 V/μm. For an $X_{epi}=1$ μm, a breakdown voltage of 10V for diode J5 is adequate.

Figure 8A:
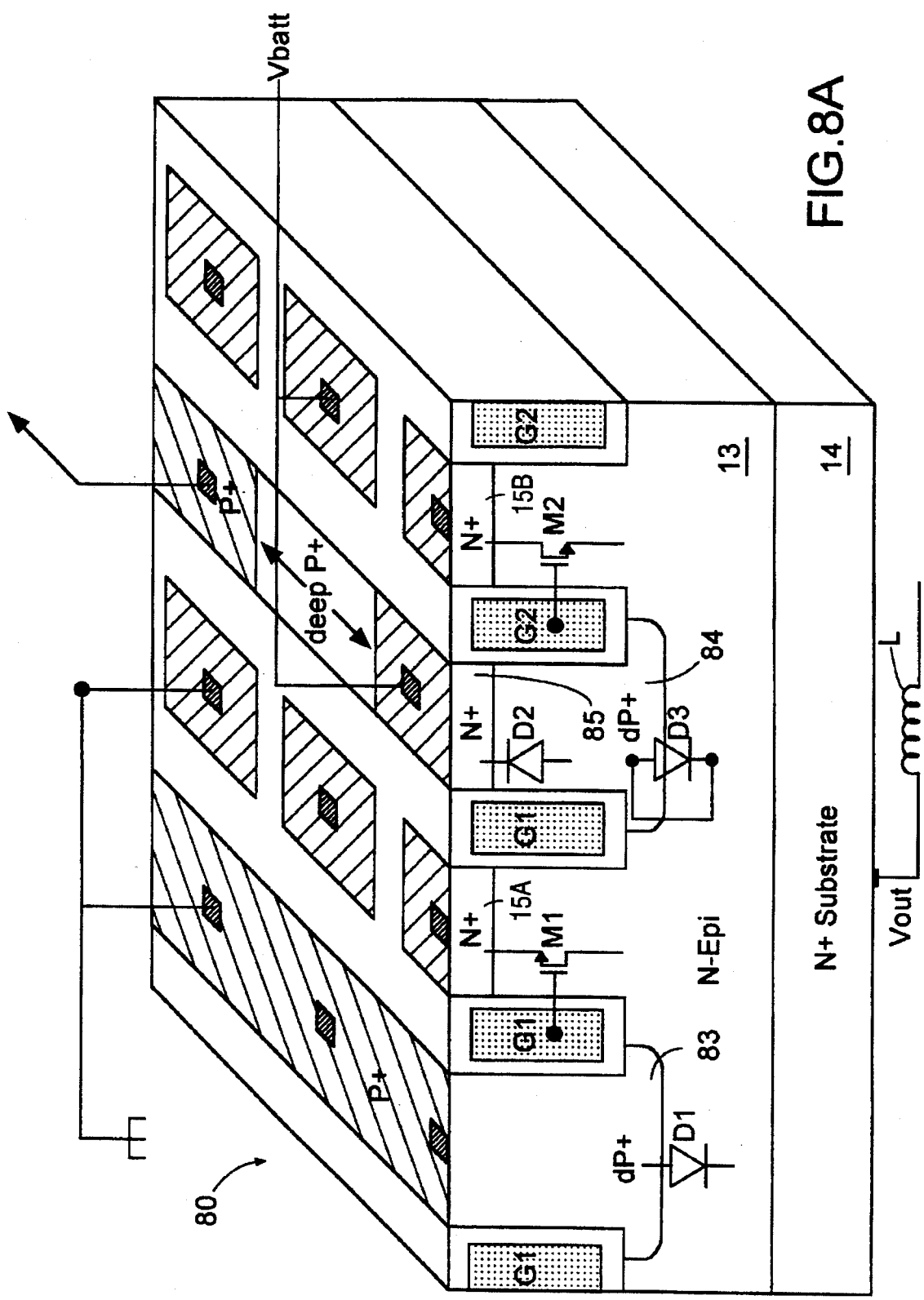
FIG. 8A illustrates a cross-sectional view of a push-pull halfbridge circuit formed in a single chip using the principles of this invention.

FIG. 8A illustrates a cross-sectional view of a push-pull halfbridge circuit 80 that is fabricated in integrated form. A trench gate G1 defines a high side ACCUFET M1, and a trench gate G2 defines a low side ACCUFET M2. A P+ region 83 is formed next to ACCUFET M1 and forms a diode D1 at a junction with N-epitaxial layer 13. A P+ region 84 is formed next to ACCUFET M2, and a shallow N+ region 85 is formed in P+ region 84, the junction of regions 84 and 85 forming a diode D2. A third diode D3 that is formed at the junction of P+ region 84 and N-epitaxial layer 13 is shorted out by a connection (not shown) between P+ region 84 and N+ substrate 14.

The output of circuit 80 is taken at N+ substrate 14 (or from a top side N+ contact) and leads to a coil L, which could be a coil of a motor, for example. The N+ source region 15A of ACCUFET M1 and P+ region 83 are tied in common to ground, and the N+ drain region 15B of ACCUFET M2 and N+ region 85 are tied in common to a battery voltage $V_{batt}$. N+ substrate 14 and N-epitaxial layer 13 serve as the drain of ACCUFET M1 and the source of ACCUFET M2. Note that the normal nomenclature has been departed from in respect of ACCUFET M2, the more positive terminal being designated as the drain.

Figure 8B:
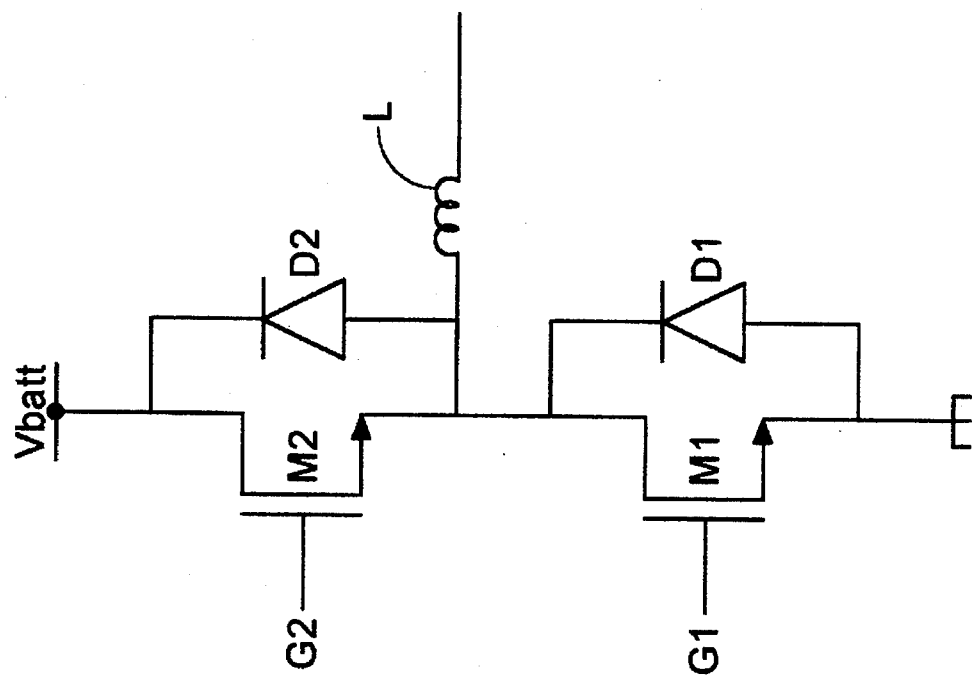
FIG. 8B illustrates an equivalent circuit diagram of the halfbridge circuit shown in FIG. 8A.

A schematic circuit diagram for circuit 80 is shown in FIG. 8B. It will be apparent that the combination of ACCUFET M1 and diode D1 is schematically identical to an ordinary MOSFET with a source/body short and a diode in parallel with the channel. The same is true of the combination of ACCUFET M2 and diode D2. Integrating diodes into the ACCUFET is advantageous as compared with using external (discrete) diode clamps since integrated diodes have little or no parasitic inductance and can respond (break down) instantly to drain voltage spikes.

Gates G1 and G2 are biased in the normal manner so as to turn ACCUFETs M1 and M2 on and off sequentially, making sure that both ACCUFETs are never turned on simultaneously. The biasing of the gates in a push-pull halfbridge circuit is described in the above-referenced application No. 08/367,515. Diodes D1 and D2 clamp the output (N+ substrate 14) as follows. For increases in the output voltage, diode D1 clamps $V_{out}$ to the breakdown voltage of diode D1 ($BV_{D1}$), and diode D2 clamps $V_{out}$ to a diode drop (approximately 0.6 V) above $V_{batt}$. $V_{out}$ cannot exceed the lower of these two values. For decreases in the output voltage (negative-going transients), diode D2 clamps $V_{out}$ to the battery voltage minus the breakdown voltage of diode D2 ($V_{batt}-BV_{D2}$), and diode D1 clamps $V_{out}$ to a diode drop below ground. $V_{out}$ cannot fall below the higher of these two values. Thus, assuming that the high-side gate drive is referenced to $V_{out}$, regardless of the inductive voltage spikes that might appear at the output as coil L is switched, the voltage across the oxide layers of gates G1 and G2 is limited by diodes D1 and D2. Note, however, that in this embodiment the N-epitaxial layer 13 absorbs some of the voltage difference between N+ substrate 14 and gates G1 and G2, so the gate oxide layers are not necessarily exposed to the full amount of this voltage difference.

Figure 9:
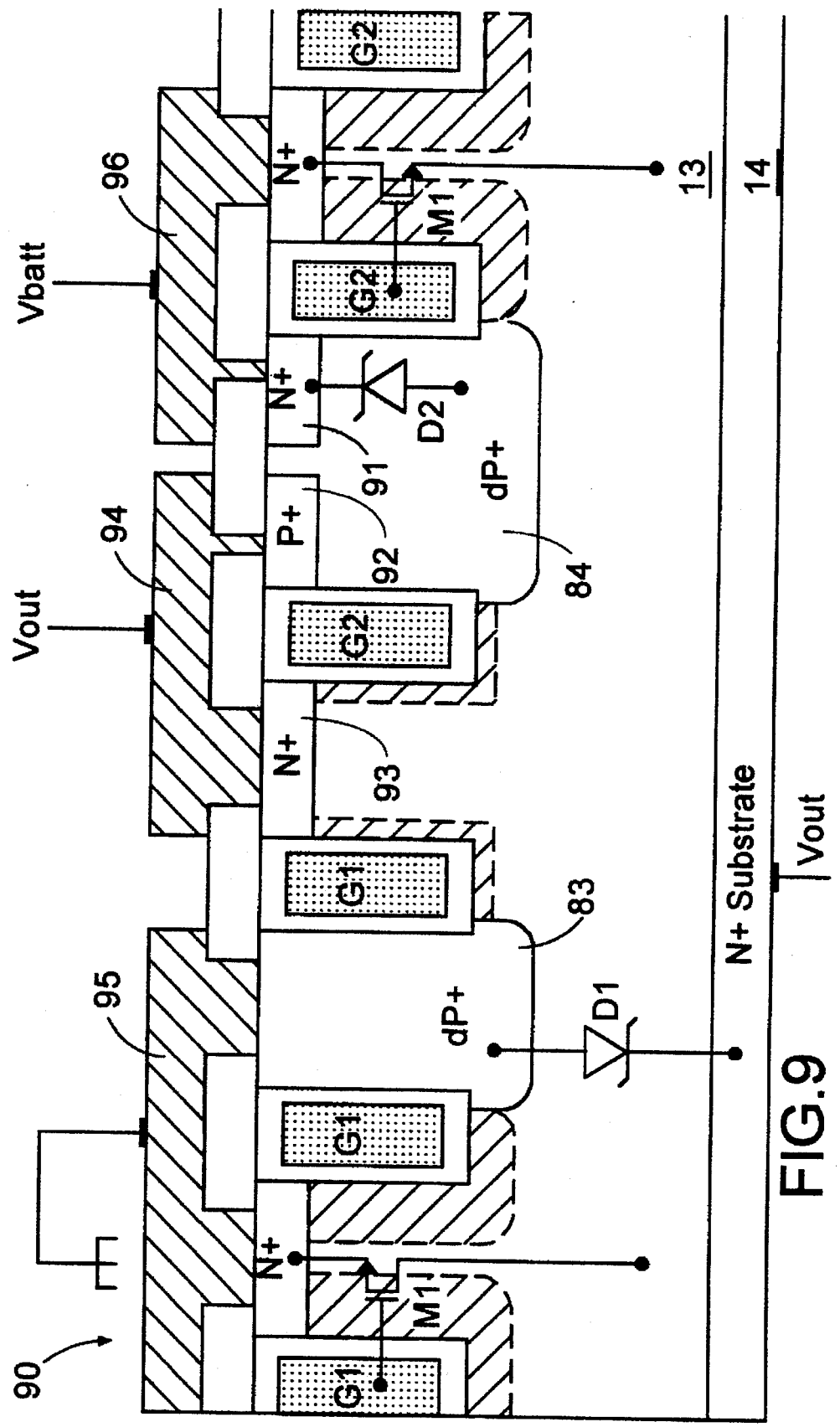
FIG. 9 illustrates an alternative embodiment of a push-pull halfbridge circuit in accordance with this invention.

FIG. 9 illustrates in cross-section an alternative push-pull halfbridge circuit 90 which is somewhat similar to circuit 80. In circuit 90, however, P+ region 83 is located between ACCUFETs M1 and M2, and P+ region 84 includes a shallow P+ contact region 92, which is doped more heavily than P+ region 84. A shallow N+ region 93 is formed at the surface of the epitaxial layer 13, and P+ region 92 is connected to N+ region via a metal layer 94. This connection short-circuits the diode at the junction of P+ region 84 and N-epitaxial layer 13 and permits the output $V_{out}$ of the halfbridge circuit to be obtained either at the top surface (N+ region 93) or backside (N+ substrate 14) of the chip. FIG. 9 also shows a metal layer 95 which ties the source of ACCUFET M1 and P+ region 83 to ground, and a metal layer 96 which ties the drain of ACCUFET M2 and N+ region 91 to $V_{batt}$. The cross-hatched areas in FIG. 9 represent the depletion spreading around gates G1 and G2 which pinches off current flow through ACCUFETs M1 and M2.

Figures 2, 10A:
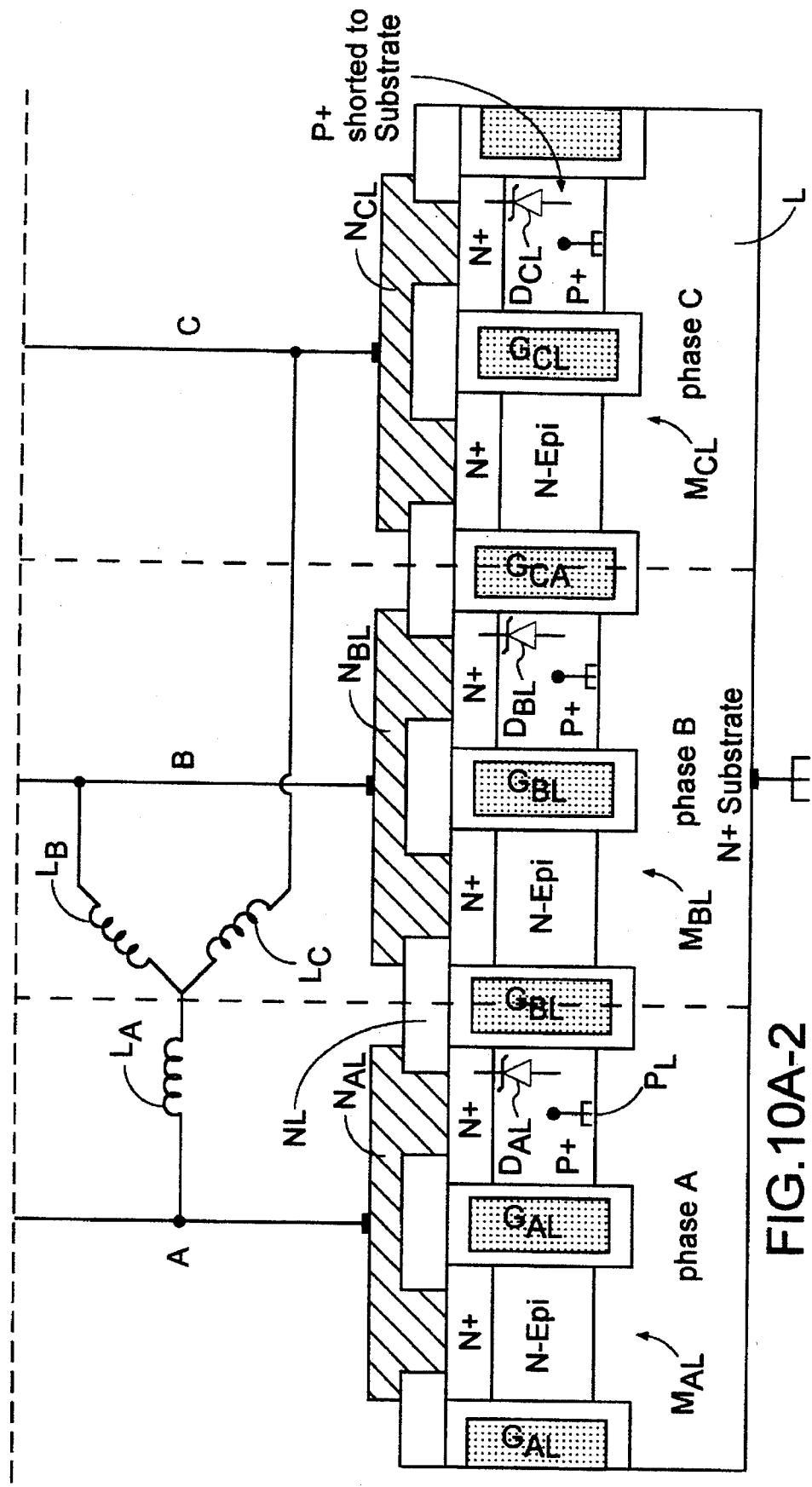
FIG. 10A illustrates a cross-sectional view of a multiple-phase motor driver formed in two chips in accordance with this invention.

FIG. 10A illustrates a three-phase motor driver 100 that is formed in two chips designated H and L that are oriented face-to-face with one another. Motor driver 100 is divided into phases A, B, and C which are connected via lines A, B, and C to coils $L_A$, $L_B$, and $L_C$, respectively. The high side chip H includes ACCUFETs $M_{AH}$, $M_{BH}$, and $M_{CH}$, which are located in phases A, B, and C, respectively. Considering first the phase A section of chip H, ACCUFET $M_{AH}$ is controlled by a gate $G_{AH}$. Located to the right of gate $G_{AH}$ are a P+ region $P_H$ and an N+ region $N_H$ which are shorted together in a location on chip H which is not shown in FIG. 10A. The junction between P+ region $P_H$ and the N+ substrate in chip H forms a diode $D_{AH}$. A metal layer $N_{AH}$ ties the anode of diode $D_{AH}$ to the source of ACCUFET $M_{AH}$. Similarly, phase B in chip H includes an ACCUFET $M_{BH}$ and a diode $D_{BH}$, and phase C in chip H includes an ACCUFET $N_{CH}$ and a diode $D_{CH}$. The anode of diode $D_{BH}$ is tied to the source of ACCUFET $M_{BH}$ by a metal layer $N_{BH}$, and the anode of diode $D_{CH}$ is tied to the source of ACCUFET $M_{CH}$ by a metal layer $N_{CH}$. The N+ substrate in chip H is connected to a positive voltage rail $V_{cc}$.

The low side chip L is generally similar in structure to high side chip H, but with several important differences. First, the N+ substrate of chip L is connected to ground. Second, considering phase A, a P+ region $P_L$ and an N+ region $N_L$ are formed on the right side of a gate $G_{AL}$, and an ACCUFET $M_{AL}$ is formed on the left side of gate $G_{AL}$. However, in chip L, P+ region $P_L$ is grounded (i.e., shorted to the N+ substrate) at a location not shown, leaving a diode $D_{AL}$ at the junction of P+ region $P_L$ and N+ region $N_L$. The cathode of diode $D_{AL}$ is tied to the drain of ACCUFET $M_{AL}$ by a metal layer $N_{AL}$. Similarly, phase B in chip L includes an ACCUFET $M_{BL}$ and a diode $D_{BL}$, and phase C in chip H includes an ACCUFET $N_{CL}$ and a diode $D_{CL}$. The cathode of diode $D_{BL}$ is tied to the drain of ACCUFET $M_{BL}$ by a metal layer $N_{BL}$, and the cathode of diode $D_{CL}$ is tied to the drain of ACCUFET $M_{CL}$ by a metal layer $N_{CL}$.

To summarize, high side chip H and low side chip L are essentially similar in structure, except that in chip H the P+ regions (e.g., P+ region $P_H$) are shorted to the N+ regions (e.g., N+ region $N_H$) whereas in chip L the P+ regions (e.g., P+ region $P_L$) are shorted to the N+ substrate. If the structural similarity between chips H and L is not important, the N+ regions beneath the P+ regions could be omitted from chip H.

Metal layers $N_{AH}$ and $N_{AL}$ are tied together and to coil $L_A$ via a line A; metal layers $N_{BH}$ and $N_{BL}$ are tied together and to coil $L_B$ via a line B; and metal layers $N_{CH}$ and $N_{CL}$ are tied together and to coil $L_C$ via a line C.

Figure 10B:
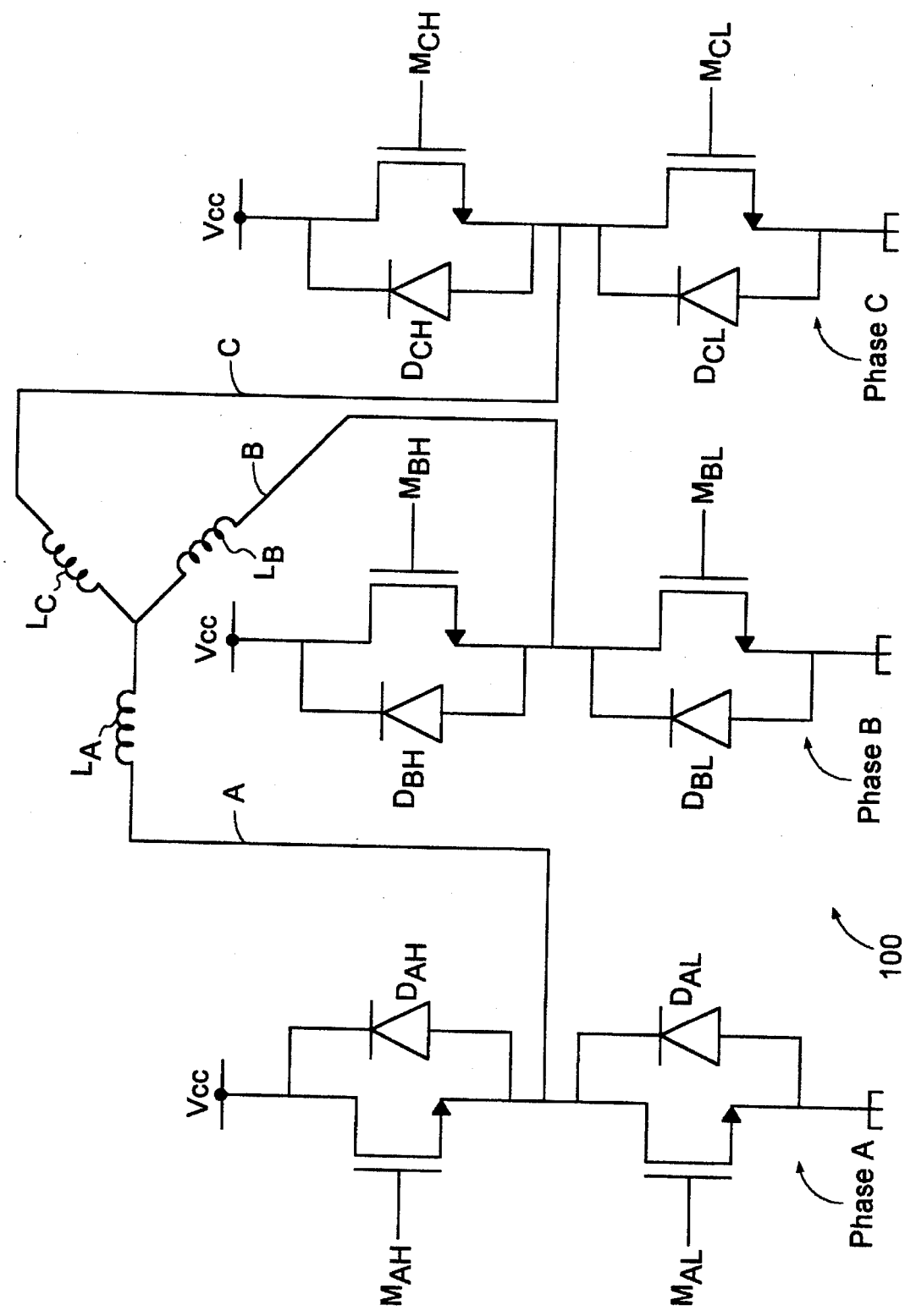
FIG. 10B illustrates an equivalent circuit diagram of the motor drive shown in FIG. 10A.

FIG. 10B shows a schematic diagram of three-phase motor driver 100. Within each phase, the ACCUFETs (e.g., ACCUFETs $M_{AH}$ and $M_{AL}$ in phase A) clamp the output in a manner similar to that described above with respect to halfbridge circuit 80 shown in FIGS. 8A and 8B. The gates of the six ACCUFETs are driven in a way which is well known in the art and which is described, for example, in application No. 08/062,968, filed May 14, 1993, now U.S. Pat. No. 5,455,496, which is incorporated herein by reference in its entirety.

The broad principles of this invention thus include a halfbridge drive in which the high side and the low side are formed in a single chip, as shown in FIGS. 8A and 9, and also include a plurality of halfbridge drives (i.e., a multiple phase driver) in which the respective high sides are formed in one chip and the respective low sides are formed in a second chip, as shown in FIG. 10A. The many additional configurations that are encompassed by these broad concepts will be apparent to those skilled in the art. For example, the three-phase drive shown in FIG. 10A could be replaced by three halfbridges of the kind shown in FIG. 8A.

Figure 11:
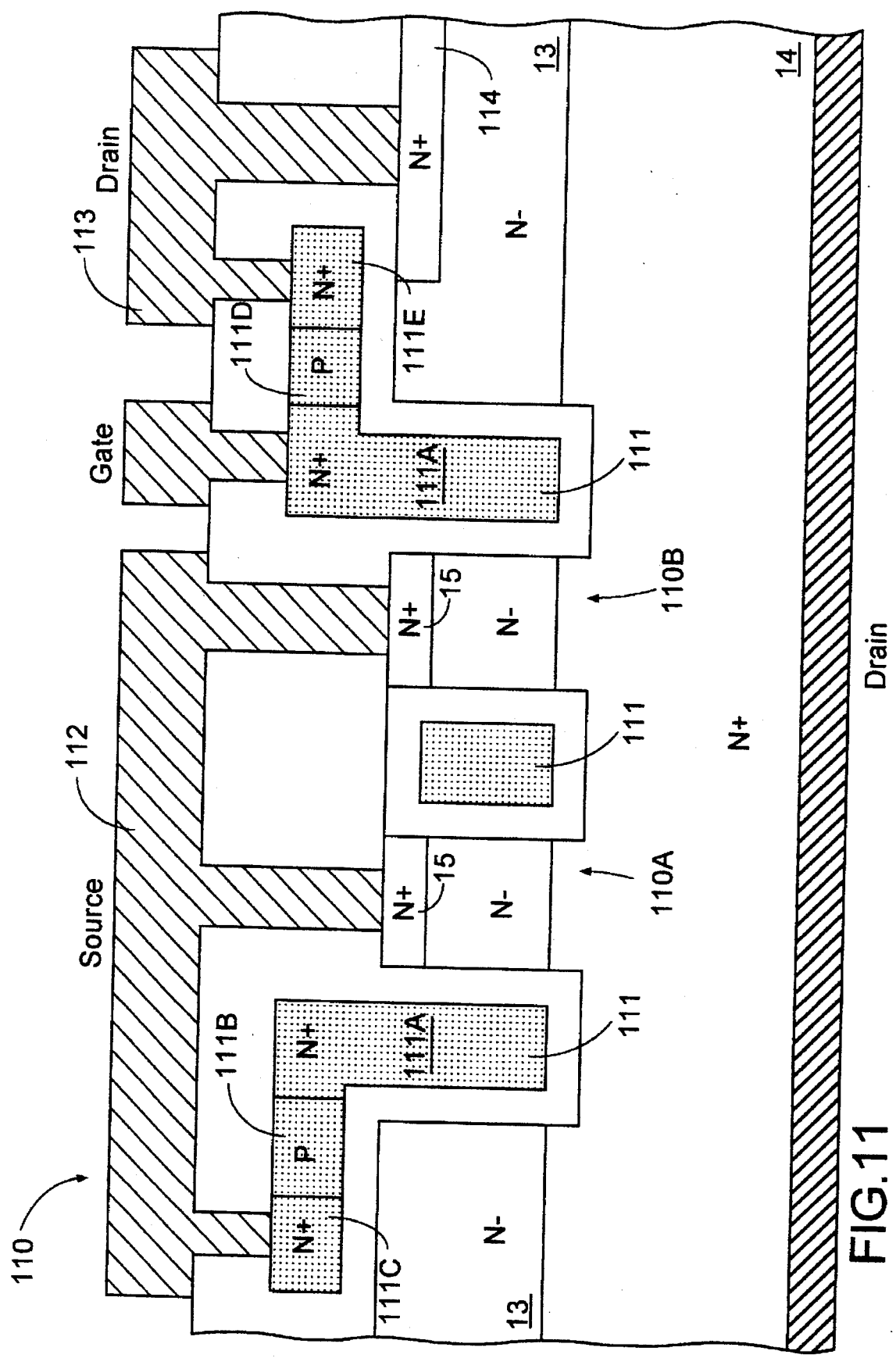
FIG. 11 illustrates a cross-sectional view of an alternative embodiment of an accumulation-mode MOSFET in which the protective diodes are formed in the polysilicon gate.

ACCUFET 110 shown in FIG. 11 represents an embodiment in which the protective diodes are formed in the doped polysilicon gate rather than in the substrate or epitaxial layer. ACCUFET 110 includes cells 110A and 110B which are defined by a trenched polysilicon gate 111. Gate 111 is etched into N-epitaxial layer 13 and N+ substrate 14. Gate 111 includes a main N+ section 111A which extends into the trenches. N+ section is doped with N-type dopant to a concentration in the range $3 \times 10^{18}$ to $5 \times 10^{19}$ cm$^{-3}$.

Gate 111 also includes a first lateral extension which includes a P region 111B and an N+ region 111C, which is connected by a metal layer 112 to the N+ source region 15 of cells 110A and 110B. P region 111B is doped to a concentration in the range $1 \times 10^{18}$ to $5 \times 10^{19}$ cm$^{-3}$, and N+ region 111C is doped to a concentration in the range $3 \times 10^{18}$ to $5 \times 10^{19}$ cm$^{-3}$. The junction between N+ region 111A and P region 111B and the junction between P region 111B and N+ region 111C create diodes which are interposed back-to-back between the source and the gate in the same manner as diodes J3 and J2, respectively, in FIG. 6B.

Gate 111 includes a second lateral extension which includes a P region 111D and an N+ region 111E, which is connected by a metal layer 113 to an N+ region 114 and thereby to the drain of ACCUFET 110 (N+ substrate 14). P region 111D is doped to a concentration in the range $1 \times 10^{18}$ to $5 \times 10^{19}$ cm$^{-3}$, and N+ region 111E is doped to a concentration in the range $3 \times 10^{18}$ to $5 \times 10^{19}$ cm$^{-3}$. The junction between N+ region 111A and P region 111D and the junction between P region 111D and N+ region 111E create diodes which are interposed back-to-back between the drain and the gate in the same manner as diodes J3 and J1, respectively, in FIG. 6B.

The breakdown voltage of a diode formed in polysilicon is a weak function of doping concentration because of the grain boundaries at the interface between the N and P regions. A normal PN junction is not present. Therefore, a succession of diodes may be formed in series in the polysilicon if it is desired to change the breakdown voltage. A typical diode formed in polysilicon has a breakdown voltage of roughly 7V.

The diodes formed in gate 111 operate in the same manner as diodes J1, J2 and J3 to clamp the voltages between the source and the gate and between the drain and the gate and thereby protect the gate oxide layer surrounding gate section 111A. Thus, when the source-to-gate voltage reaches a predetermined level, the diode at the junction of P region 111B and N+ region 111C will break down and the source voltage will be clamped to the gate voltage. Thus, the voltage across the gate oxide layer in the vicinity of N+ source region 15 will be limited to this voltage difference. As indicated above, the voltage across the gate oxide layer should not exceed 4 MV/cm·$X_{OX}$, where $X_{OX}$ is the thickness of the gate oxide layer expressed in centimeters.

If the source voltage should fall with respect to the gate voltage, the diode at the junction of N+ region 111A and P region 111B will ultimately break down and protect the gate oxide layer in a similar manner.

Similarly, when the drain-to-gate voltage reaches a predetermined level, the diode at the junction of P region 111D and N+ region 111E will break down and the drain voltage will be clamped to the gate voltage. Thus, the voltage across the gate oxide layer at the bottom of the gate trenches will be limited to this voltage difference. If the drain voltage should fall with respect to the gate voltage, the diode at the junction of N+ region 111A and P region 111D will ultimately break down and protect the gate oxide layer in a similar manner. The back-to-back diodes connected between the gate and the source and drain have the added advantage of protecting the device against electrostatic discharge.

Figure 12:
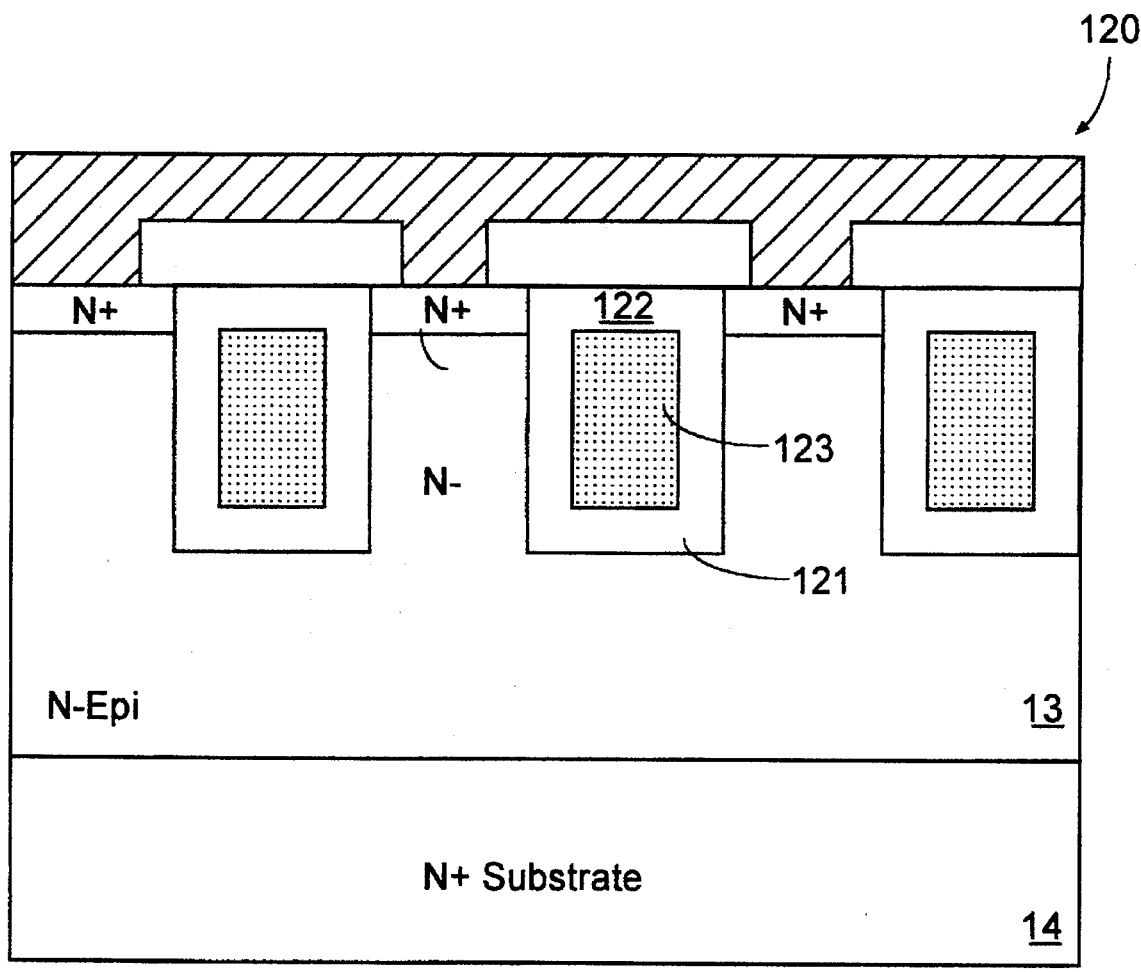
FIG. 12 illustrates a cross-sectional view of an embodiment in which a section of the gate oxide layer is made thicker to provide additional protection in the event of a high source-to-gate voltage.
Figure 13:
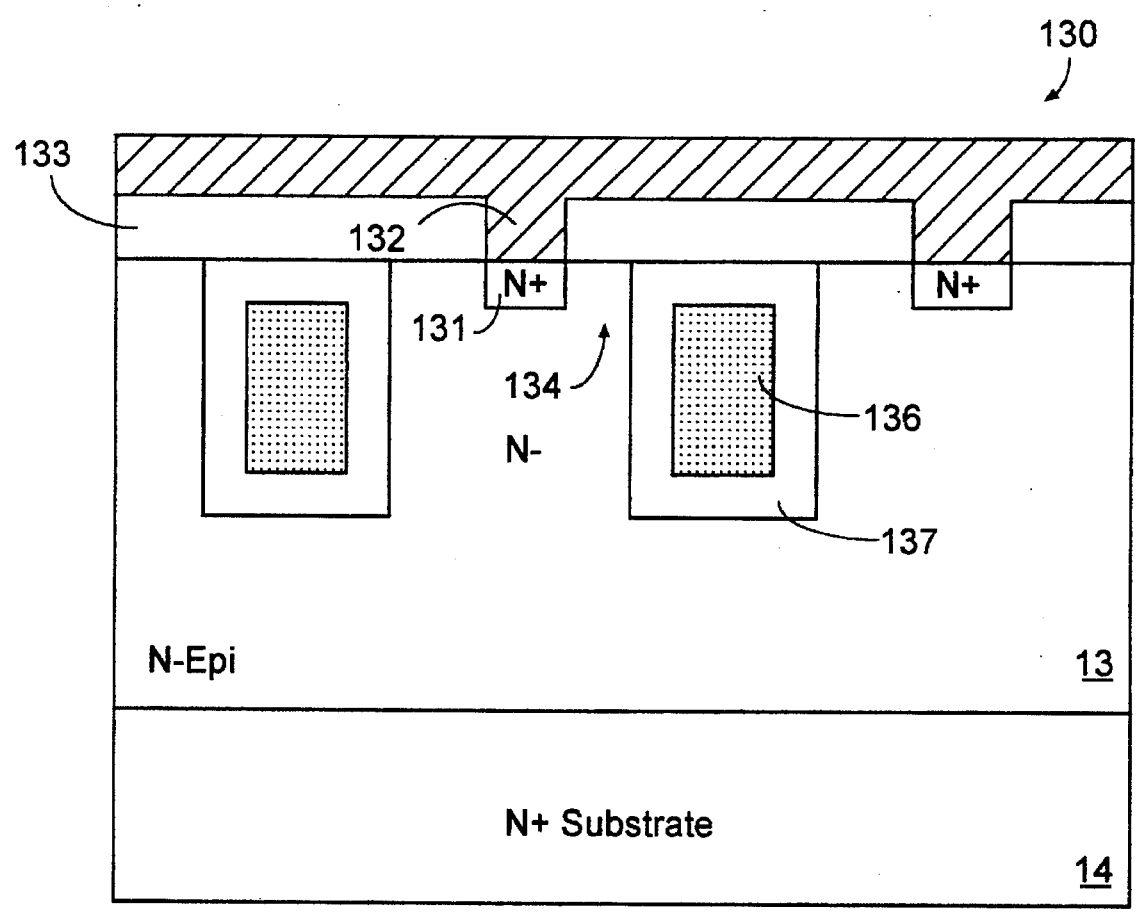
FIG. 13 illustrates a cross-sectional view of an embodiment in which the lateral dimension of the source region is reduced to provide additional protection in the event of a high source-to-gate voltage.

FIGS. 12 and 13 illustrate alternative ways of protecting the gate oxide layer against a high voltage difference between the source and gate of an accumulation-mode MOSFET. In ACCUFET 120 shown in FIG. 12, gate oxide layer 121 has a thick section 122 at the top of the gate 123. Thick oxide section 122 is able to withstand a greater voltage difference between N+ source region 124 and gate 123 (i.e., the 4 MV/cm criterion is more easily satisfied as the thickness of the gate oxide is increased). In ACCUFET 130 shown in FIG. 13, N+ source region 131 is limited laterally by reducing the lateral dimension of the contact hole 132 in the oxide layer 133 which is used as a mask during the implanting of N+ source region 131. The portion 134 of N-epitaxial layer 13 is therefore able to absorb a share of the electric field between N+ source region 131 and gate 136 in much the same way, as described above, that N-epitaxial layer 13 absorbs a portion of the voltage difference between the drain (N+ substrate 14) and gate 136. In this manner the stress on gate oxide layer 137 is reduced whenever the silicon (i.e., source or drain) potential is made positive with respect to the gate. The maximum gate voltage in the on-state is determined only by the gate oxide thickness.

In accordance with another aspect of this invention, a gate bias generator controls the gate potential thereby allowing the ACCUFET to be used as an AC switch. Referring again to FIG. 6E, gate bias generator 74 must find the lower of the source and drain voltages in ACCUFET 60 as the AC signal oscillates and must adjust the gate bias to a proper value relative to that voltage so that ACCUFET 60 remains either in an on or off state.

Figure 14A:
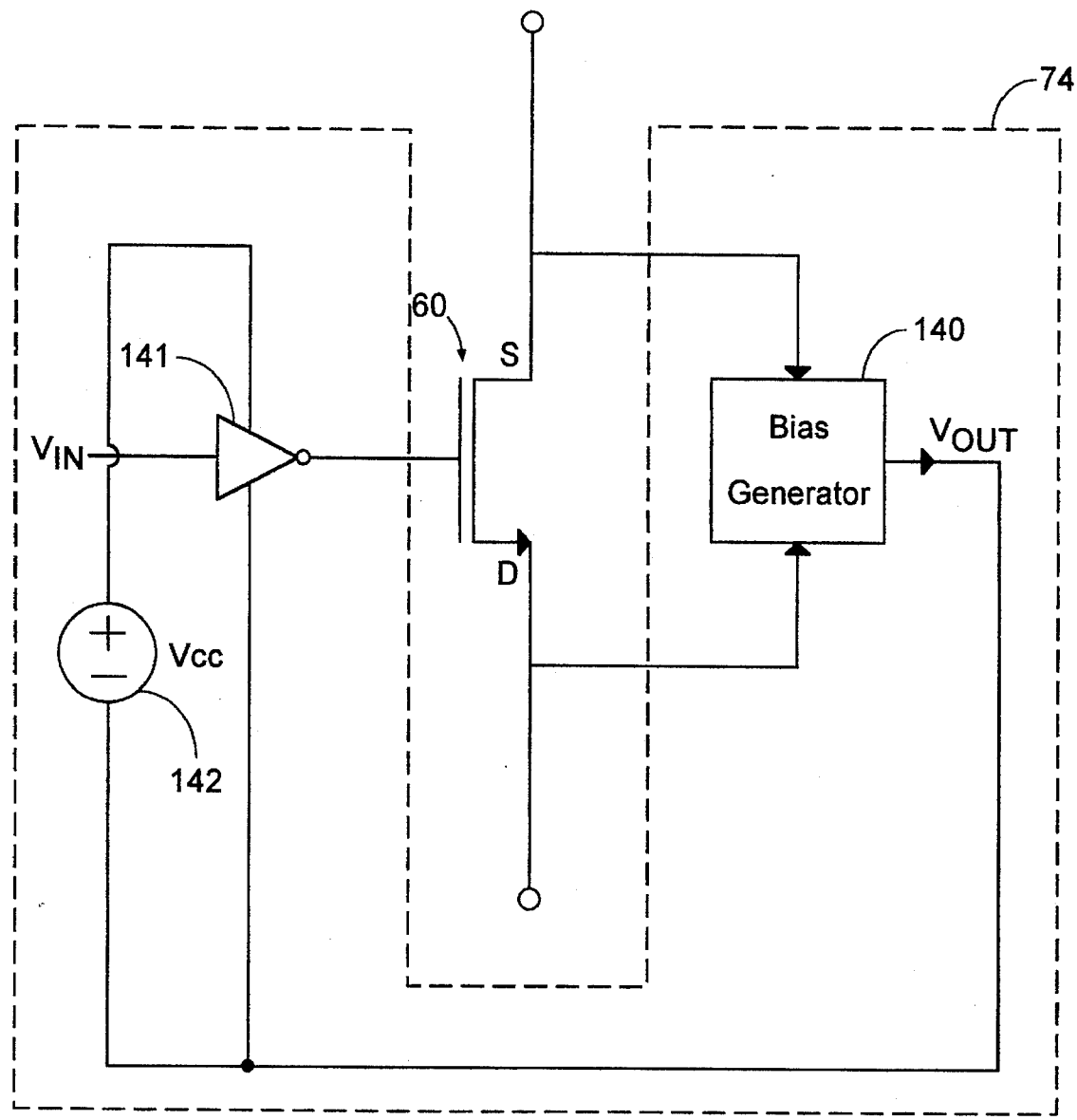
FIG. 14A illustrates a schematic diagram of the gate bias generator used to control the gate voltage in an accumulation-mode MOSFET used as a bidirectional or AC switch.
Figure 14B:
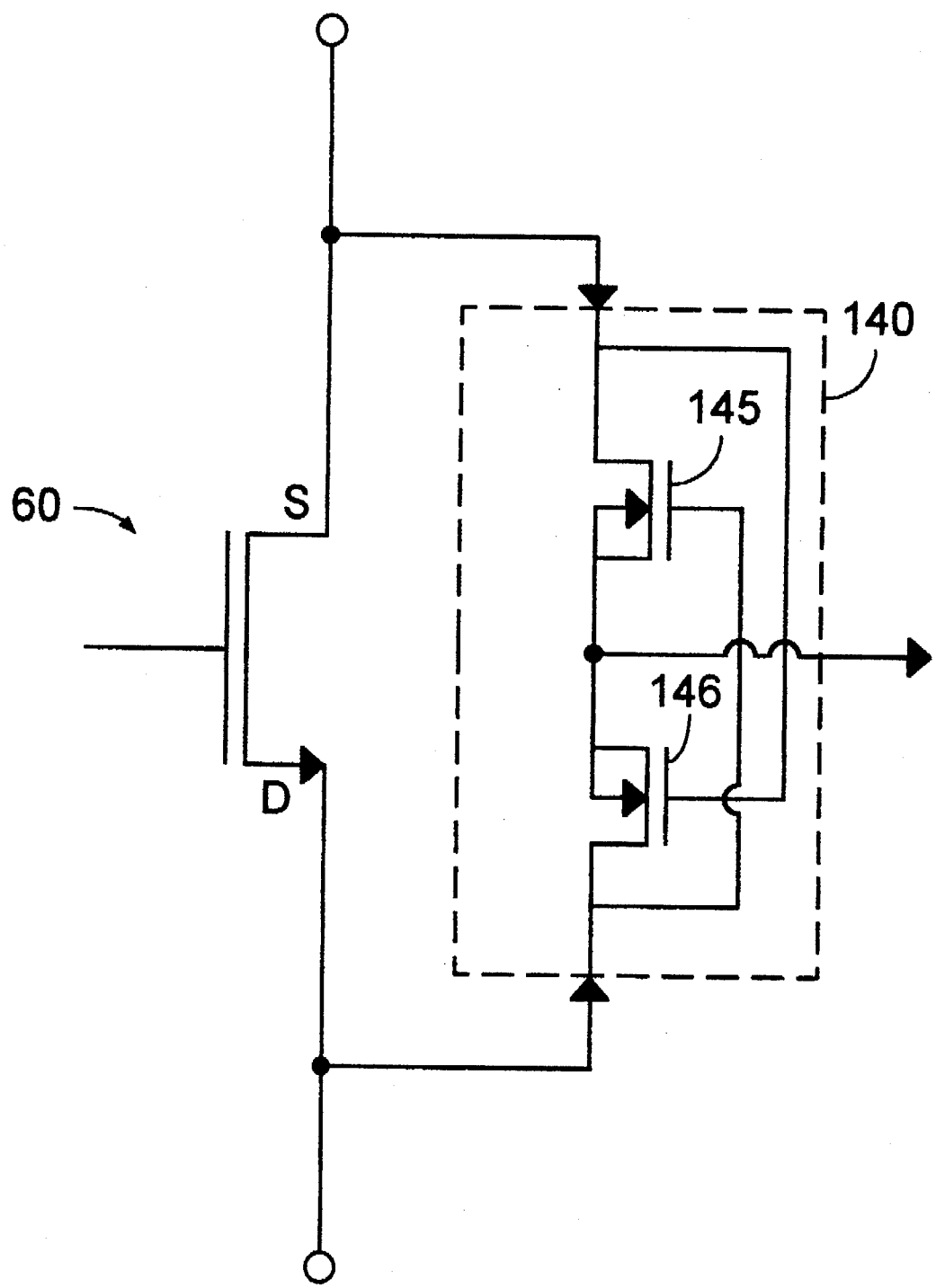
FIG. 14B illustrates a schematic diagram of the bias generator circuit within the gate bias generator shown in FIG. 14A.
Figure 15A:
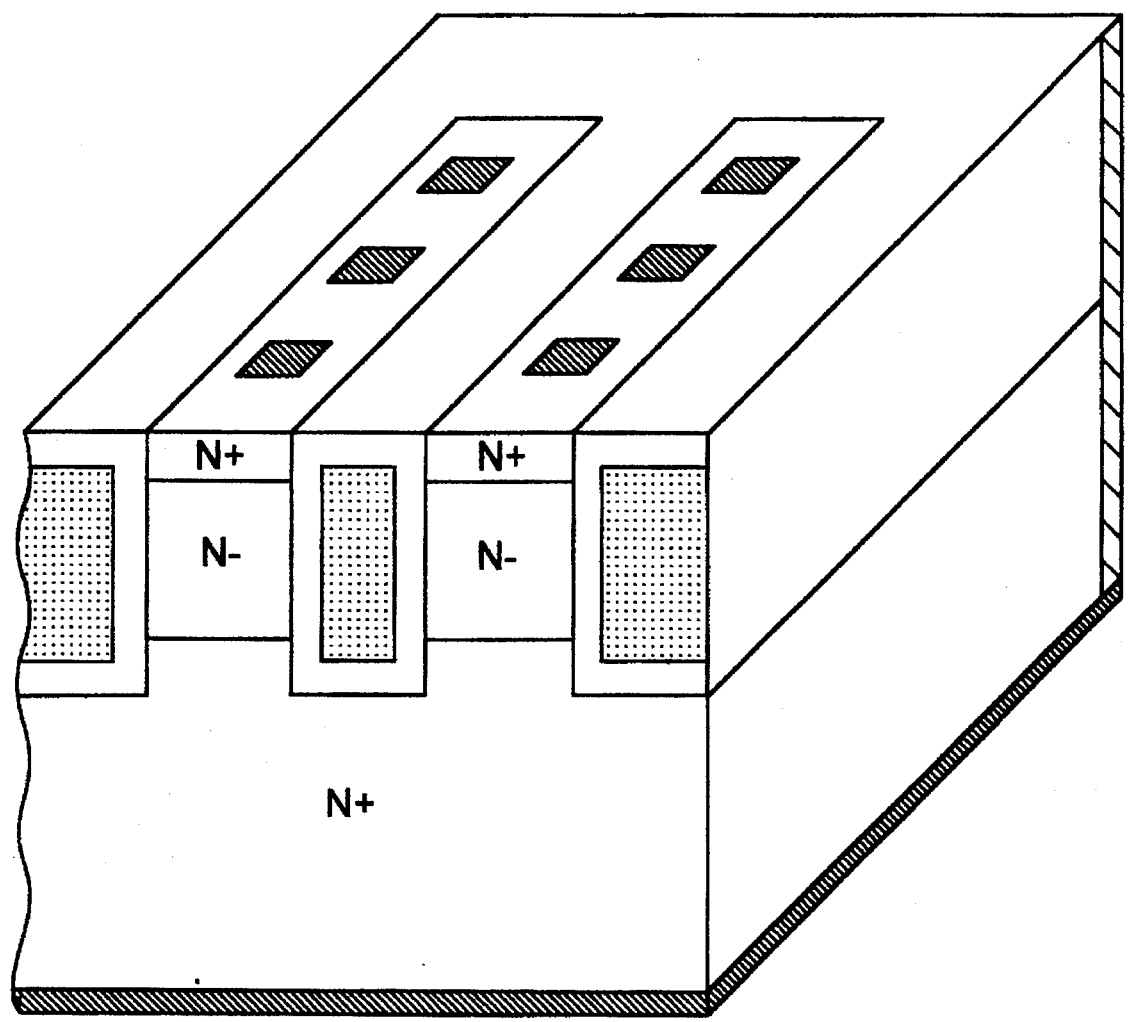
FIG. 15A illustrates a cross-sectional view of a striped-cell accumulation-mode MOSFET.
Figure 15B:
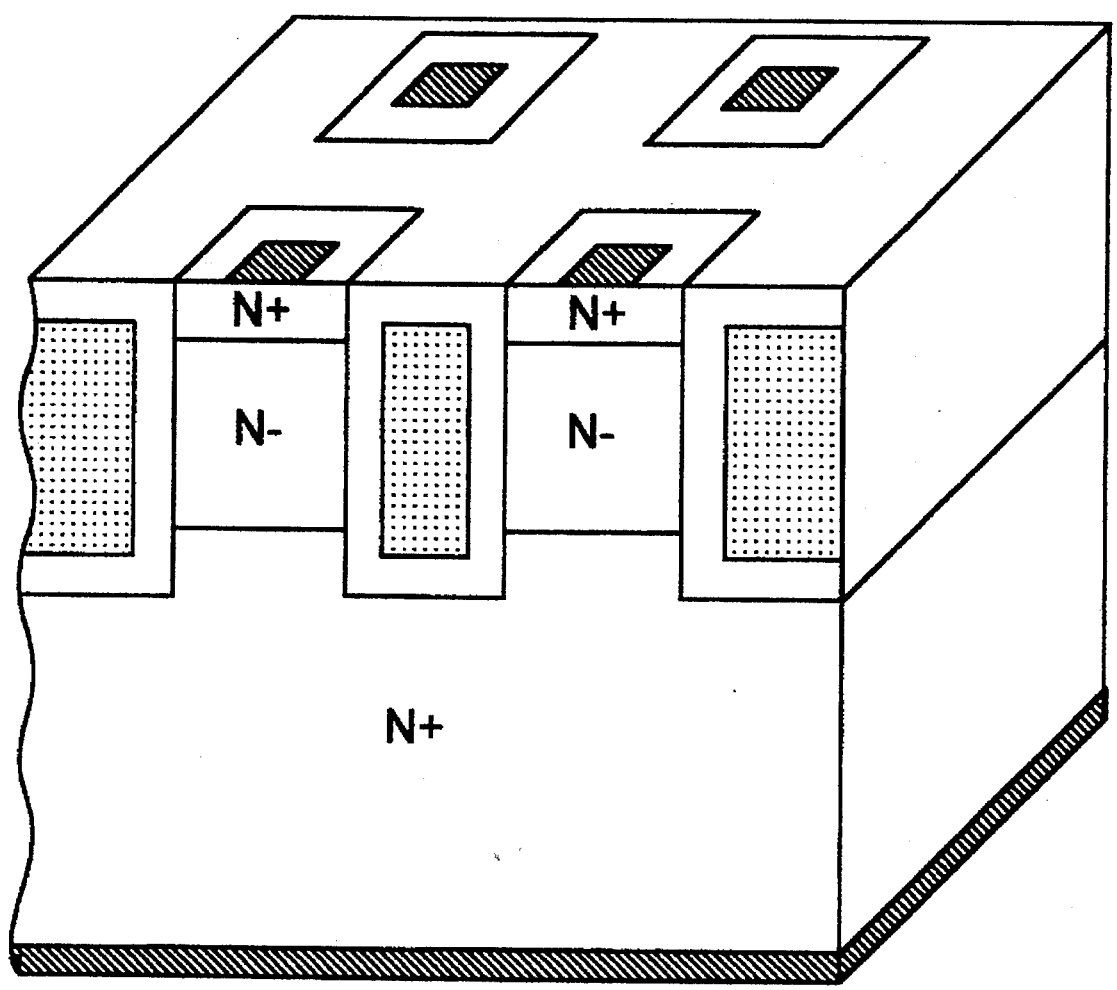
FIG. 15B illustrates a cross-sectional view of a rectangular cell accumulation-mode MOSFET.

FIG. 14A illustrates a schematic diagram of gate bias generator 74. A bias generator circuit 140 is similar to the body bias generator described in the above-referenced application No. 08/367,515, in that it produces an output voltage $V_{out}$ which is equal to the lower of the source and drain voltages of ACCUFET 60. FIG. 14B illustrates a circuit diagram of bias generator circuit 140, which includes a pair of MOSFETs 145 and 146. MOSFET 145 is connected between the source of ACCUFET 60 and the output of bias generator circuit 140, and MOSFET 146 is connected between the drain of ACCUFET 60 and the output of bias generator circuit 140. MOSFETs 145 and 146 contain a conventional source-body short. The gate of MOSFET 145 is connected to the drain of ACCUFET 60, and the gate of MOSFET 146 is connected to the source of ACCUFET 60.

MOSFETs 145 and 146 function to short the output of bias generator circuit 140 to whichever of the source and drain terminals of ACCUFET is at a lower voltage. Because the gate terminals of MOSFETs 145 and 146 are cross-coupled to the drain and source terminals of ACCUFET 60, respectively, MOSFET 145 will turn on whenever the voltage at the drain exceeds the voltage at the source of ACCUFET 60, and MOSFET 146 will turn on whenever the voltage at the source exceeds the voltage at the drain of ACCUFET 60. In other words, MOSFET 145 functions to short the output of bias generator circuit 140 to the source of ACCUFET 60 when the voltage at the source is lower than the voltage at the drain of ACCUFET 60, and MOSFET 146 functions to short the output of bias generator circuit 140 to the drain of ACCUFET 60 when the voltage at the drain is lower than the voltage at the source of ACCUFET 60. Thus, the coordinated operation of MOSFETs 145 and 146 ensures that the output of bias generator circuit 140 is clamped to whichever of the drain and source terminals of ACCUFET 60 is biased most negatively. This assumes, of course, that the drain-to-source voltage of ACCUFET 60 exceeds the threshold voltage necessary to turn one of MOSFETs 145 and 146 on.

In the circuit shown in FIG. 14A, the output of bias generator circuit 140 is connected to the low-side power input of a gate buffer 141 and through a voltage source 142 to the high-side power input of the same gate buffer. Since the output of buffer 141 is connected to the gate of ACCUFET 60, the gate of ACCUFET 60 is biased either at a voltage that is equal to the lower of the source and drain voltages of ACCUFET 60 or at a specified level ($V_{cc}$) above that voltage. The input signal $V_{in}$ for gate buffer 141 is used to select between $V_{out}$ and $V_{out}+V_{cc}$ the gate drive for ACCUFET 60. This is precisely the condition that is required to ensure that ACCUFET 60 is turned either off or on, regardless of the polarity of its source-to-drain voltage, and therefore allows ACCUFET 60 to function as an bidirectional or AC switch.

The embodiments described above are illustrative only and are not intended to be limiting of the broad scope of this invention.

We claim:

1. An accumulation-mode MOSFET comprising:

a semiconductor chip;

a gate formed in a trench at a surface of said semiconductor chip and separated from said semiconductor chip by an insulating layer, said trench defining a cell of said MOSFET, a first region of said semiconductor chip being located within said cell and containing semiconductor material of a first conductivity type, said cell being designed such that a substantial portion of said first region is depleted thereby preventing the flow of current through said first region when said gate is held at a predetermined voltage;

a second region of said first conductivity type located under said trench;

a third region of a second conductivity type adjacent said second region, a junction between said second and third regions forming a first diode; and a fourth region of said first conductivity type adjacent said third region, a junction between said third and fourth regions forming a second diode, wherein said fourth region is connected to said gate.

2. The MOSFET of claim 1 further comprising a fifth region of said first conductivity type adjacent said third region, a junction between said third and fifth regions forming a third diode, wherein said fifth region is connected to said first region.

3. The MOSFET of claim 4 wherein said first and second diodes are connected back-to-back.

4. An accumulation-mode field-effect transistor (MOSFET) comprising:

a semiconductor material;

a gate positioned in a trench at a surface of said semiconductor material and separated from said semiconductor material by a gate insulating layer, said trench defining a transistor cell, said cell containing substantially only material of a first conductivity type;

a first heavily-doped region of said first conductivity type located at a surface of said cell;

a lightly-doped region of said first conductivity type adjacent said heavily-doped region;

a first PN junction within said semiconductor material, said first PN junction forming a first diode; and a second PN junction within said semiconductor material, said second PN junction forming a second diode, said first and second diodes being connected in series between said heavily doped region and said gate.

5. The MOSFET of claim 4 wherein said first diode is connected between said gate and a second heavily-doped region of said first conductivity type, said second heavily-doped region being located in said semiconductor material below said trench.

6. The MOSFET of claim 5 further comprising a third PN junction within said semiconductor material, said third PN junction forming a third diode, said third diode being connected in series with said first diode between said second heavily-doped region and said gate.

7. A halfbridge circuit formed in a semiconductor chip, said halfbridge circuit comprising:

a first accumulation-mode MOSFET, said first accumulation-mode MOSFET comprising a first trenched gate, a first heavily-doped region of a first conductivity type located at a surface of said chip, a second lightly-doped region of said first conductivity type located below said first region, and a third heavily-doped region of said first conductivity type located below said second lightly-doped region;

a second accumulation-mode MOSFET, said second accumulation-mode MOSFET comprising a second trenched gate, a fourth heavily-doped region of said first conductivity type located at a surface of said chip, a fifth lightly-doped region of said first conductivity type located below said fourth region, and said third heavily-doped region of said first conductivity type;

a first voltage supply connected to said first heavily-doped region and a second voltage supply connected to said fourth heavily-doped region; and an output terminal connected to said third heavily-doped region.

8. The halfbridge circuit of claim 7 further comprising:
a sixth region of a second conductivity type, a junction of said sixth region forming a first diode, said first diode being connected in parallel with said first accumulation-mode MOSFET; and
a seventh region of said second conductivity type, a junction of said seventh region forming a second diode, said second diode being connected in parallel with said second accumulation-mode MOSFET.

9. The halfbridge circuit of claim 8 wherein said first diode is formed at a junction of said second and sixth regions.

10. The halfbridge circuit of claim 8 wherein said second diode is formed at a junction of said seventh region and an eighth region of said first conductivity type.

11. The halfbridge circuit of claim 7 wherein said second and fifth regions are contiguous.

12. The halfbridge circuit of claim 7 wherein said first, second, fourth and fifth regions are part of an epitaxial layer.

13. The halfbridge circuit of claim 12 wherein said third region is included in a substrate.

14. The halfbridge circuit of claim 8 wherein said seventh region is connected to said third region.

15. The halfbridge circuit of claim 10 further comprising a ninth region of said first conductivity type located at a surface of said chip, said ninth region being adjacent said third region, said seventh region being connected to said ninth region.

16. A multiple-phase motor driver comprising:
a first chip, said first chip comprising a plurality of high side accumulation-mode MOSFETs; and
a second chip, said second chip comprising a plurality of low side accumulation-mode MOSFETs;
wherein a substrate of said first chip is connected to a first voltage source and a substrate of said second chip is connected to a second voltage source, and wherein a first MOSFET in said first chip is connected to a first MOSFET in said second chip and to a first output terminal, and a second MOSFET in said first chip is connected to a second MOSFET in said second chip and to a second output terminal.

17. The multiple-phase motor drive of claim 16 further comprising a first diode formed in said first chip, said first diode being connected in parallel with said first MOSFET in said first chip.

18. The multiple-phase motor drive of claim 17 wherein said first diode is formed at a junction of a first region and said substrate, said substrate being doped with a dopant of a first conductivity type and said first region being doped with a dopant of a second conductivity type.

19. The multiple-phase motor drive of claim 18 wherein said first region is connected to said first output terminal.

20. The multiple-phase motor drive of claim 19 wherein said first region is connected to said first output terminal via a second region of a second conductivity type located at a surface of said first chip, said first and second regions being shorted together.

21. The multiple-phase motor drive of claim 16 further comprising a first diode formed in said second chip, said first diode being connected in parallel with said first MOSFET in said second chip.

22. The multiple-phase motor drive of claim 21 wherein said first diode is formed at a junction of a first region of a first conductivity type and a second region of a second conductivity type.

23. The multiple-phase motor drive of claim 22 wherein said first region is located at a surface of said second chip and said second region is shorted to said substrate of said second chip.

24. An accumulation-mode MOSFET comprising:
a semiconductor chip of a first conductivity type;
a trenched gate formed in said chip, said gate defining a MOSFET cell, said gate comprising a first region doped with a dopant of said first conductivity type, a second region adjacent said first region and doped with a dopant of a second conductivity type, and a third region adjacent said second region and doped with a dopant of said first conductivity type;
wherein said third region is connected to a surface of said MOSFET cell.

25. The accumulation-mode MOSFET of claim 24 wherein said gate further comprises a fourth region adjacent said first region and doped with a dopant of said second conductivity type, and a fifth region adjacent said fourth region and doped with a dopant of said first conductivity type and wherein said fifth region is connected to a backside of said semiconductor chip.

26. An accumulation-mode MOSFET comprising:
a semiconductor chip of a first conductivity type;
a trenched gate formed in said chip, said gate defining a MOSFET cell, said gate comprising a first region doped with a dopant of said first conductivity type, a second region adjacent said first region and doped with a dopant of a second conductivity type, and a third region adjacent said second region and doped with a dopant of said first conductivity type;
wherein said third region is connected to a backside of said semiconductor chip.

27. The accumulation-mode MOSFET of claim 1 or 2 wherein said first region comprises a heavily-doped source region adjacent said surface and a lightly-doped drift region adjacent said source region.

28. The accumulation-mode MOSFET of claim 1 or 2 wherein said second region comprises a drain region having a contact on an opposite surface of said chip.

29. The accumulation-mode MOSFET of claim 1 wherein said third and fourth regions are located on an opposite side of said trench from said first region.

30. The accumulation-mode MOSFET of claim 2 wherein said third, fourth and fifth regions are located on an opposite side of said trench from said first region.

31. An accumulation-mode field-effect transistor (MOSFET) comprising:
a semiconductor material;
a gate positioned at least partially in a trench formed at a surface of said semiconductor material, said gate being separated from said semiconductor material by a gate insulating layer, said trench defining a transistor cell, said cell containing substantially only material of a first conductivity type;
a first heavily-doped region of said first conductivity type located at a surface of said cell;
a lightly-doped region of said first conductivity type adjacent said heavily-doped region;
a second heavily-doped region of said first conductivity type located in said semiconductor material below said trench;
wherein said gate is formed of polysilicon, said polysilicon being doped so as to form first and second diodes in said gate, said first and second diodes being connected in series between a portion of said gate within said trench and said first heavily-doped region.

32. The MOSFET of claim 31 wherein said first and second diodes are connected back-to-back.

33. The MOSFET of claim 31 wherein said polysilicon is doped so as to form third and fourth diodes in said gate, said third and fourth diodes being connected in series between said portion of said gate within said trench and a third heavily-doped region of said first conductivity type, said third heavily-doped region being coupled to said second heavily-doped region.

34. The MOSFET of claim 33 wherein said third and fourth diodes are connected back-to-back.

35. An accumulation-mode field-effect transistor (MOSFET) comprising:

a semiconductor material;

a gate positioned at least partially in a trench formed at a surface of said semiconductor material, said gate being separated from said semiconductor material by a gate insulating layer, said trench defining a transistor cell, said cell containing substantially only material of a first conductivity type;

a first heavily-doped region of said first conductivity type located at a surface of said cell;

a lightly-doped region of said first conductivity type adjacent said heavily-doped region;

a second heavily-doped region of said first conductivity type located in said semiconductor material below said trench;

wherein said gate is formed of polysilicon, said polysilicon being doped so as to form first and second diodes in said gate, said first and second diodes being connected in series between a portion of said gate within said trench and third heavily-doped region of said first conductivity type, said third heavily-doped region being coupled to said second heavily-doped region.

36. The MOSFET of claim 35 wherein said first and second diodes are connected back-to-back.

* * * * *